US009691759B2

(12) United States Patent
Uchida et al.

(10) Patent No.: US 9,691,759 B2
(45) Date of Patent: Jun. 27, 2017

(54) SEMICONDUCTOR DEVICE INCLUDING SEMICONDUCTOR SUBSTRATE, SILICON CARBIDE SEMICONDUCTOR LAYER, UNIT CELLS, SOURCE, AND GATE

(71) Applicant: Panasonic Intellectual Property Management Co., Ltd., Osaka (JP)

(72) Inventors: Masao Uchida, Osaka (JP); Nobuyuki Horikawa, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/251,886

(22) Filed: Aug. 30, 2016

(65) Prior Publication Data

US 2017/0098647 A1 Apr. 6, 2017

(30) Foreign Application Priority Data

Oct. 1, 2015 (JP) ................. 2015-195690

(51) Int. Cl.
*H01L 29/06* (2006.01)
*H01L 27/06* (2006.01)
*H01L 29/16* (2006.01)
*H01L 29/78* (2006.01)

(52) U.S. Cl.
CPC ...... *H01L 27/0629* (2013.01); *H01L 29/1608* (2013.01); *H01L 29/7827* (2013.01)

(58) Field of Classification Search
None
See application file for complete search history.

(56) References Cited

U.S. PATENT DOCUMENTS

| 2003/0042538 | A1 | 3/2003 | Kumar et al. |
| 2009/0200608 | A1* | 8/2009 | Shirai ................. H01L 29/0696 257/334 |
| 2010/0148718 | A1 | 6/2010 | Kitabatake et al. |
| 2011/0024838 | A1 | 2/2011 | Kitazawa et al. |
| 2011/0254051 | A1* | 10/2011 | Tsuzuki ............ H01L 21/26586 257/140 |

(Continued)

FOREIGN PATENT DOCUMENTS

| JP | 2003-068759 | 3/2003 |
| JP | 2011-029466 | 2/2011 |

(Continued)

*Primary Examiner* — Ali Naraghi
(74) *Attorney, Agent, or Firm* — McDermott Will & Emery LLP

(57) ABSTRACT

A semiconductor device includes a first silicon carbide semiconductor layer, a source including a source pad and a source wiring, a gate including a gate pad and a gate wiring, first unit cells disposed in a first element region, and second unit cells disposed in a second element region. In a plan view, the first and second element regions are adjacent to each other with the gate wiring between the first and second element regions. A first electrode including the gate electrode of each first unit cell is disposed in the first element region and electrically connected to the gate. A second electrode including the gate electrode of each second unit cell is disposed in the second element region and not electrically connected to the gate. The first and second electrodes are separated below the gate wiring.

13 Claims, 25 Drawing Sheets

(56) References Cited

U.S. PATENT DOCUMENTS

| | | | |
|---|---|---|---|
| 2012/0280315 A1* | 11/2012 | Shirai | H01L 29/475 |
| | | | 257/334 |
| 2012/0286290 A1 | 11/2012 | Uchida | |
| 2014/0231828 A1 | 8/2014 | Horikawa et al. | |
| 2015/0001549 A1 | 1/2015 | Miura et al. | |
| 2015/0054069 A1* | 2/2015 | Shirai | H01L 29/475 |
| | | | 257/334 |
| 2015/0349051 A1* | 12/2015 | Uchida | H01L 29/0619 |
| | | | 257/77 |

FOREIGN PATENT DOCUMENTS

| | | |
|---|---|---|
| JP | 2014-127660 | 7/2014 |
| WO | 2007/013367 | 2/2007 |
| WO | 2012/056704 | 5/2012 |
| WO | 2013/103051 | 7/2013 |
| WO | 2014/041808 | 3/2014 |

\* cited by examiner

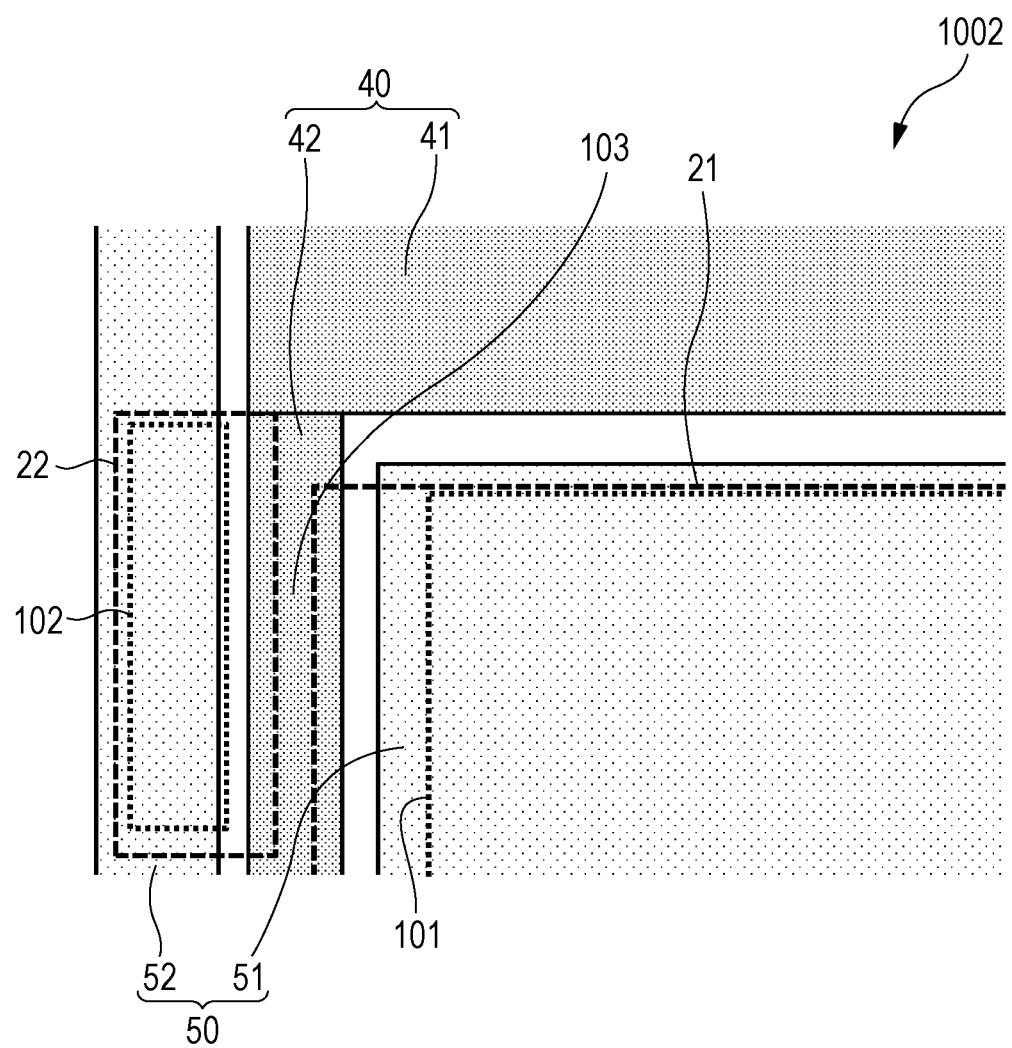

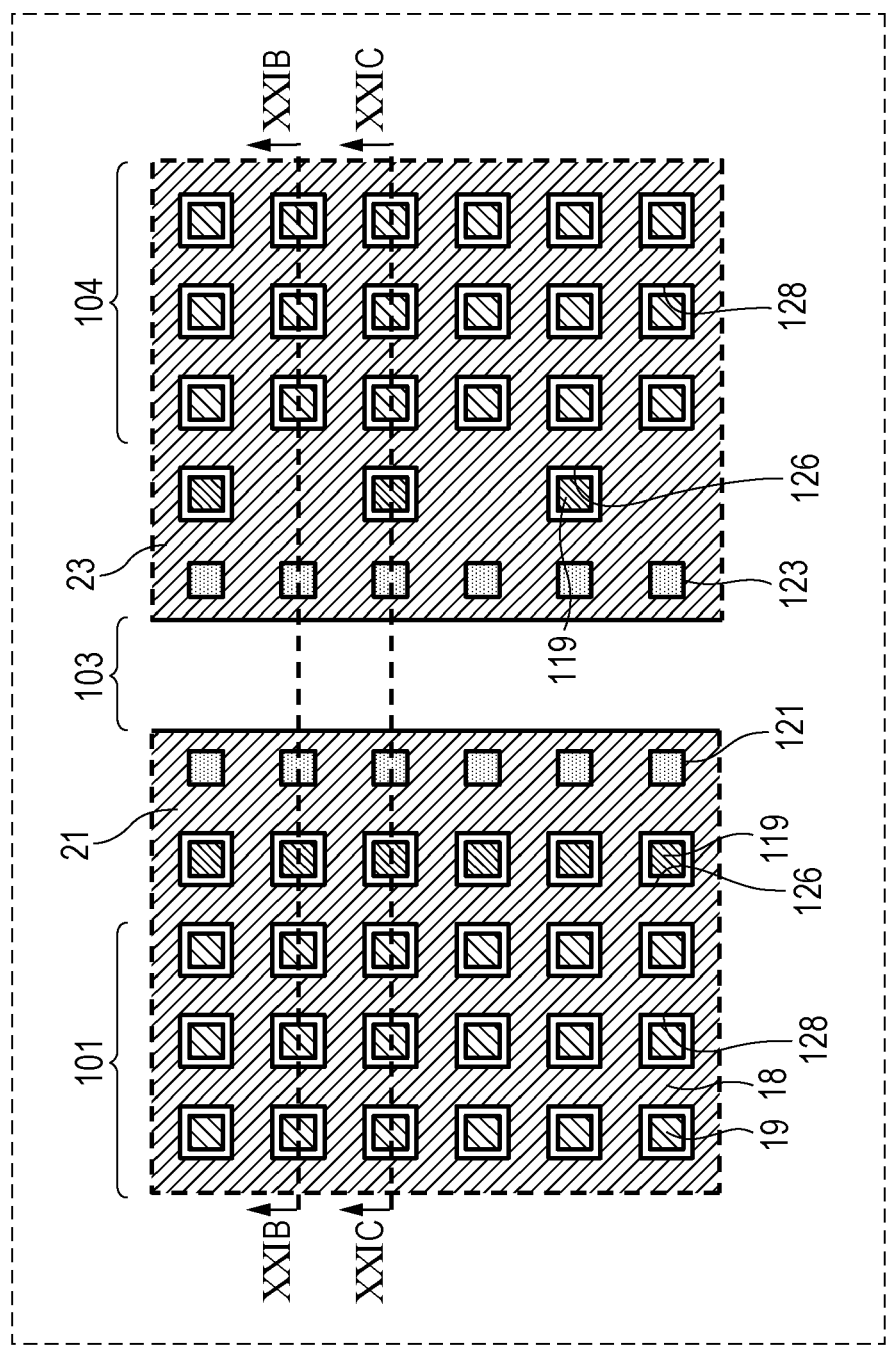

SEMICONDUCTOR DEVICE INCLUDING SEMICONDUCTOR SUBSTRATE, SILICON CARBIDE SEMICONDUCTOR LAYER, UNIT CELLS, SOURCE, AND GATE

BACKGROUND

1. Technical Field

The present disclosure relates to a semiconductor device.

2. Description of the Related Art

Silicon carbide (SiC) is a semiconductor material that is wider in band gap and higher in hardness than silicon (Si). SiC is applied to power elements such as switching elements and rectifying elements. SiC-based power elements have the advantage, for example, of being better able to reduce electric power loss than Si-based power elements.

Typical SiC-based semiconductor devices are metal-insulator-semiconductor field-effect transistors (MISFETs) and Schottky-barrier diodes (SBDs). A metal-oxide-semiconductor field-effect transistor (MOSFET) is a type of MISFET. Further, a junction-barrier Schottky-barrier diode (JBS) is a type of SBD.

Use of a SiC-MISFET as a switching element, for example, in an electric power converter that controls the drive of a load such as a motor has been under discussion. Use of a MISFET as a switching element in an electric power converter may cause a freewheeling current to flow through the electric power converter when the MISFET is in an off state. In a common inverter circuit, a freewheeling current flows through a freewheeling diode externally connected in antiparallel to the MISFET. In a case where a SiC-MISFET is applied to an inverter circuit, an SBD made of SiC is selected as the freewheeling diode. An SBD is an unipolar element, and has the merit of being smaller in reverse recovery loss than a p-n diode, which is a bipolar element. It should be noted that a SiC-MISFET has inside a parasitic p-n diode including a p-n junction. This parasitic p-n diode is herein referred to as "body diode". In general, as a freewheeling diode, a body diode is not actively used, but an SBD, which is a unipolar element, is selected.

However, use of separate semiconductor chips to form a transistor and a diode that functions as a reflex diode may lead to an increase in the total number of chips, and accordingly to an increase in footprint. Further, an increase in the number of wirings connecting one chip to another may lead to an increase in parasitic inductance, and by extension to noise generation. Given these circumstances, a configuration in which a transistor and a diode are formed in one semiconductor chip has been proposed. A transistor thus configured is herein referred to as "diode-containing transistor".

A SiC-based diode-containing transistor is proposed, for example, in International Publication No. 2007/013367. International Publication No. 2007/013367 discloses an example in which a SiC-MISFET includes an arrangement of diode cells each having a Schottky electrode. In this example, an SBD connected in antiparallel to the MISFET can be formed in a chip. This makes it possible to achieve a semiconductor chip that has both the function of switching of the MISFET and the function of the freewheeling diode.

SUMMARY

In one general aspect, the techniques disclosed here feature a semiconductor device including: a semiconductor substrate of a first conductivity type, having a first principal surface and a second principal surface; a first silicon carbide semiconductor layer of the first conductivity type, disposed on the first principal surface of the semiconductor substrate; unit cells; a source including a source pad and a source wiring extending from the source pad; and a gate including a gate pad and a gate wiring extending from the gate pad. Each of the unit cells includes: a body region of a second conductivity type, disposed in the first silicon carbide semiconductor layer; a source region of the first conductivity type, disposed in contact with the body region; a second silicon carbide semiconductor layer of the first conductivity type, disposed on the first silicon carbide semiconductor layer and in contact with at least part of the body region and at least part of the source region; a gate insulating layer disposed on the second silicon carbide semiconductor layer; a gate electrode disposed on the gate insulating layer and above the body region, the gate insulating layer and the second silicon carbide semiconductor layer being interposed between the gate electrode and the body region; a source electrode electrically connected to the source region and electrically connected to the source; and a drain electrode disposed on the second principal surface of the semiconductor substrate. The unit cells include first unit cells disposed in a first element region and second unit cells disposed in a second element region, and in a plan view, the first element region and the second element region are adjacent to each other with the gate wiring interposed between the first and second element regions. At least some of the first unit cells are disposed below one of the source pad and the source wiring, and at least some of the second unit cells are disposed below another of the source pad and the source wiring. A first electrode including the gate electrode of each of the first unit cells is disposed in the first element region and electrically connected to the gate, and a second electrode including the gate electrode of each of the second unit cells is disposed in the second element region and not electrically connected to the gate. The first electrode and the second electrode are separated from each other below the gate wiring.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 17 is a plan view illustrating part of a semiconductor device of a first modification of Embodiment 1;

FIG. 21A is a top view for explaining a positional relationship between a first electrode, a third electrode, and contact portions in the semiconductor device of the second modification of Embodiment 1;

DETAILED DESCRIPTION

Figure 1:
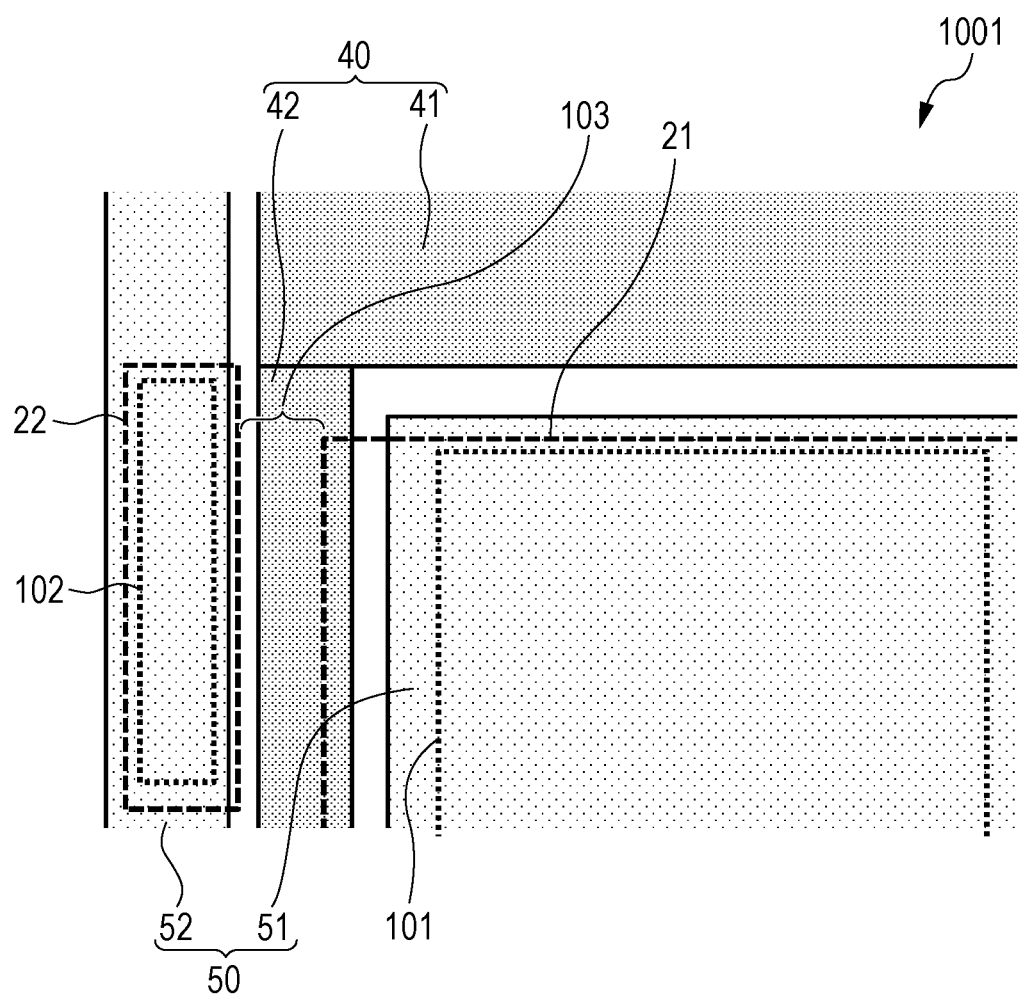
FIG. 1 is a schematic top view illustrating part of a semiconductor device of Embodiment 1.

The diode-containing transistor disclosed in International Publication No. 2007/013367 includes Schottky electrodes that are not needed for a common MISFET. This requires a separate step of forming the Schottky electrodes in addition to the step of forming the MISFET, thus making the manufacturing process complicated.

One aspect of the present disclosure is summarized as follows:

In one aspect of the present disclosure, a semiconductor device includes: a semiconductor substrate of a first conductivity type, having a first principal surface and a second principal surface; a first silicon carbide semiconductor layer of the first conductivity type, disposed on the first principal surface of the semiconductor substrate; unit cells; a source including a source pad and a source wiring extending from the source pad; and a gate including a gate pad and a gate wiring extending from the gate pad. Each of the unit cells includes: a body region of a second conductivity type, disposed in the first silicon carbide semiconductor layer; a source region of the first conductivity type, disposed in contact with the body region; a second silicon carbide semiconductor layer of the first conductivity type, disposed on the first silicon carbide semiconductor layer and in contact with at least part of the body region and at least part of the source region; a gate insulating layer disposed on the second silicon carbide semiconductor layer; a gate electrode disposed on the gate insulating layer and above the body region, the gate insulating layer and the second silicon carbide semiconductor layer being interposed between the gate electrode and the body region; a source electrode electrically connected to the source region and electrically connected to the source; and a drain electrode disposed on the second principal surface of the semiconductor substrate. The unit cells include first unit cells disposed in a first element region and second unit cells disposed in a second element region, and in a plan view, the first element region and the second element region are adjacent to each other with the gate wiring interposed between the first and second element regions. At least some of the first unit cells are disposed below one of the source pad and the source wiring, and at least some of the second unit cells are disposed below another of the source pad and the source wiring. A first electrode including the gate electrode of each of the first unit cells is disposed in the first element region and electrically connected to the gate, and a second electrode including the gate electrode of each of the second unit cells is disposed in the second element region and not electrically connected to the gate. The first electrode and the second electrode are separated from each other below the gate wiring.

The semiconductor device according to the aspect of the present disclosure allows a metal-insulator-semiconductor field-effect transistor and a unipolar diode, which requires no Schottky electrodes, to be disposed in the same element.

In the semiconductor device according to the aspect of the present disclosure, the first electrode may be electrically connected to the gate wiring below the gate wiring.

In the semiconductor device according to the aspect of the present disclosure, the second electrode may be electrically connected to the source.

In the semiconductor device according to the aspect of the present disclosure, in a plan view, the second electrode may extend from the second element region so as to partially overlap the gate wiring.

In the semiconductor device according to the aspect of the present disclosure, the unit cells may further include third unit cells disposed in a third element region. In the semiconductor device according to the aspect of the present disclosure, in a plan view, the third element region may be adjacent to the first element region with the gate wiring interposed between the first and third element regions. In the semiconductor device according to the aspect of the present disclosure, a third electrode including the gate electrode of each of the third unit cells may be disposed in the third element region and separated from the first electrode and the second electrode.

In the semiconductor device according to the aspect of the present disclosure, the third electrode may be electrically connected to the source.

In the semiconductor device according to the aspect of the present disclosure, the third electrode may be electrically connected to the gate.

In the semiconductor device according to the aspect of the present disclosure, in a plan view, the third electrode may extend from the third element region so as to partially overlap the gate wiring.

The semiconductor device according to the aspect of the present disclosure may further include a second-conductivity-type region disposed below the gate wiring and disposed in the first silicon carbide semiconductor layer. In the semiconductor device according to the aspect of the present disclosure, in a plan view, the first electrode and the second electrode may be separated from each other above the second-conductivity-type region.

In the semiconductor device according to the aspect of the present disclosure, in a plan view, the second-conductivity-type region may overlap part of the first electrode and part of the second electrode, and the second-conductivity-type region and the source may be electrically connected to each other in an opening in the first electrode and an opening in the second electrode.

In the semiconductor device according to the aspect of the present disclosure, when, in each of the first unit cells, Vds and Vgs, which are electric potentials based on the source electrode, are applied to the drain electrode and the gate electrode, respectively, in a case where Vgs≥Vth, where Vth is a gate threshold voltage, an electric current may flow from the drain electrode to the source electrode, and in a case where Vgs<Vth, as Vds becomes smaller than 0 volt, an electric current may flow from the source electrode to the drain electrode via the second silicon carbide semiconductor layer before an electric current starts to flow from the source electrode to the drain electrode via the body region.

In the semiconductor device according to the aspect of the present disclosure, when Vgs is 0 volt, Vds at which an electric current of 1 mA flows from the source electrode to the drain electrode via the second silicon carbide semiconductor layer may be equal to or larger than −1 V at room temperature. In the semiconductor device according to the aspect of the present disclosure, each of the first unit cells may be a transistor, and each of the second unit cells may be a diode.

Embodiment 1

The following describes a semiconductor device of Embodiment 1 according to the present disclosure. The semiconductor device of Embodiment 1 is described here by taking a diode-containing SiC-MISFET as an example, but needs only be an element in which a diode and a field-effect transistor are formed with the same silicon carbide semiconductor layer.

The semiconductor device of Embodiment 1 is a SiC-MISFET containing unipolar diodes. The semiconductor device includes transistor cells that function as transistors and diode cells that function as unipolar diodes. In Embodiment 1, each of the diode cells may have a transistor structure in which a gate and a source are electrically connected to each other. The diode cells share common sources with the transistor cells, and these sources function as anodes of the diodes. The diode cells share common drains with the transistor cells, and these drains function as cathodes of the diodes. Electrodes of a diode cell having a transistor structure are herein referred to as "source", "drain", and "gate", respectively, as in the case of a transistor cell.

Figure 2:
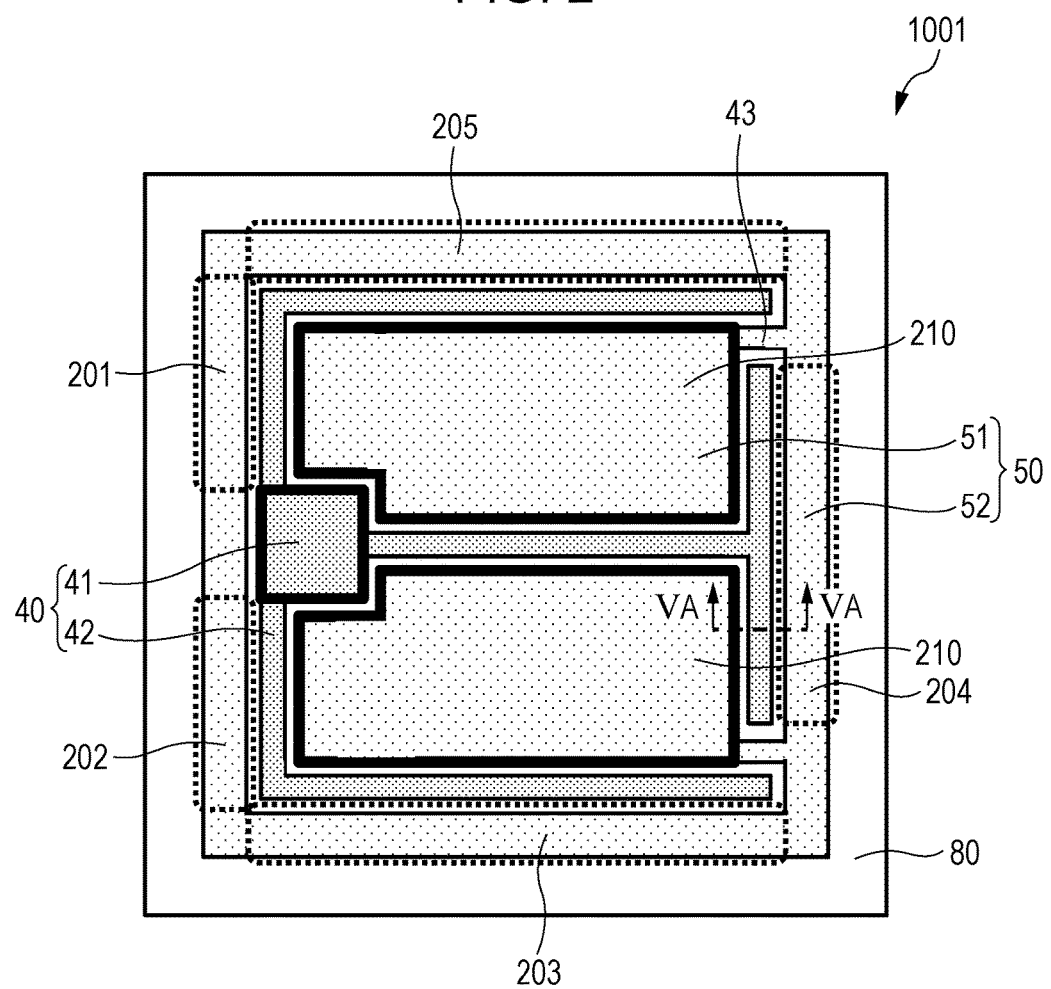
FIG. 2 is a schematic top view illustrating the semiconductor device of Embodiment 1.

FIG. 1 is a schematic top view illustrating part of a semiconductor device 1001 of Embodiment 1. FIG. 2 is a schematic top view illustrating the semiconductor device 1001 of Embodiment 1.

The semiconductor device 1001 includes unit cells supported on a substrate, a gate 40 including a gate pad 41 and a gate wiring 42, and a source 50 including a source pad 51 and a source wiring 52. The source 50 and the gate 40 are disposed above the unit cells. The gate pad 41 and the source pad 51 are pads for supplying electrical signals to the semiconductor device 1001. For example, wires made of aluminum are bonded to these pads.

The source wiring 52 extends from the source pad 51. The gate wiring 42 extends from the gate pad 41. Further, at least part of the gate wiring 42 is disposed between the source pad 51 and the source wiring 52 in such a way as to divide them from each other.

The unit cells are disposed in element regions including a first element region 101 and a second element region 102.

The unit cells include first unit cells disposed in the first element region 101 and second unit cell disposed in the second element region 102. As will be described in detail later, each of the first and second unit cells has a transistor structure having a source electrode, a drain electrode, and a gate electrode. In Embodiment 1, the first unit cells are transistor cells, and the second unit cells are diode cells.

The element region in which the transistor cells are disposed is herein referred to as "transistor region", and the element region in which the diode cells are disposed is herein referred to as "diode region". In Embodiment 1, the first element region 101 is a transistor region, and the second element region 102 is a diode region.

The first element region 101 and the second element region 102 are disposed such that a boundary between them is a portion of the gate wiring 42 that is located between the source pad 51 and the source wiring 52. In this example, at east some of the first unit cells in the first element region 101 are disposed below the source pad 51, and at least some of the second unit cells in the second element region 102 are disposed below the source wiring 52. It should be noted that at least some of the first unit cells may be disposed below the source wiring 52 and at least some of the second unit cells may be disposed below the source pad 51. For the sake of simplicity, the following description takes, as an example, the positional relationship shown in FIG. 1.

In the first element region 101, a first electrode 21 electrically connected to the gate 40 is disposed. The first electrode 21 extends from the first element region 101 to below the gate wiring 42, and is electrically connected to the gate wiring 42 below the gate wiring 42. Each of the first unit cells includes part of the first electrode 21 as its gate electrode. Each of the first unit cells has its source electrode electrically connected to the source 50.

In the second element region 102, a second electrode 22 is disposed. The second electrode 22 is not electrically connected to the gate 40. Each of the second unit cells includes part of the second electrode 22 as its gate electrode. The second electrode 22 may be connected to the source 50, or may be in a floating state without being connected to any wiring. Each of the second unit cells has its source electrode electrically connected to the source 50.

The first electrode 21, which serves as the gate electrodes of the first unit cells, and the second electrode 22, which serves as the gate electrodes of the second unit cells, are placed at a certain distance from each other, and are electrically separated from each other. In Embodiment 1, an insulating region 103 is disposed between the first element region 101 and the second element region 102 so as to separate the first electrode 21 and the second electrode 22 from each other. At least part of the insulating region 103 is located below the gate wiring 42.

In Embodiment 1, it is not necessary to form, for example, Schottky electrodes or the like, as the second unit cells, which are diode cells, also have the same transistor structure as the first unit cells, which are transistor cells. This makes it possible to provide a diode-containing transistor without making the manufacturing process complicated.

Further, in Embodiment 1, the first element region 101 and the second element region 102 are disposed adjacent to each other with the gate wiring 42 between the first element region 101 and the second element region 102, and the insulating region 103 is disposed below the gate wiring 42. This brings about the following advantageous effects:

In general, a second-conductivity-type region for ensuring a withstand voltage is provided below the gate wiring 42. The second-conductivity-type region will be described in detail later. For this reason, the region in which the gate wiring 42 is disposed is a region in which no unit cells are formed. In the semiconductor device 1001 of Embodiment 1, the region in which no unit cells are formed are utilized to separate the first electrode 21 and the second electrode 22 from each other. By thus effectively utilizing a region in the element that has another function, the first electrode 21 and the second electrode 22 can be insulated from each other without the formation of a "non-functional region" in a region in which unit cells can be disposed. Therefore, Embodiment 1 makes it possible to achieve a further reduction in size of a diode-containing transistor, for example in comparison with a configuration (e.g., International Publication No. 2014/041808 filed by the present applicant) in which diode cells and transistor cells are placed at intervals from one another below a source pad.

In the example shown in FIG. 1, when seen in a plan view, the second electrode 22 is disposed in such a way as to overlap the source wiring 52, but does not overlap the gate wiring 42. It should be noted that, as will be described later, the second electrode 22 of the second element region 102 may extend to below the gate wiring 42. That is, when seen in a plan view, the second electrode 22 and the gate wiring 42 may partially overlap each other.

The semiconductor device 1001 may further include a third element region in which third unit cells are disposed. When seen in a plan view, the third element region may be adjacent to the first element region 101 or the second element region 102 with the gate wiring 42 interposed therebetween. In the third element region, a third electrode that serves as the gate electrodes of the third unit cells is disposed. The third electrode is placed at a distance from the first electrode 21 and the second electrode 22, and is electrically connected to the source 50 or the gate 40. Connecting the third electrode to the source 50 causes the third unit cells to function as diode cells. Connecting the third electrode to the gate 40 causes the third unit cells to function as transistor cells. As such, the third element region may be either a diode region or a transistor region. It should be noted that an electrode that functions as the gate electrodes of unit cells in an element region, such as the first electrode 21, the second electrode 22, or the third electrode, is herein sometimes referred to as "gate common electrode".

Next, an example of a positional relationship between the source 50 and gate 40 and the transistor and diode regions in the semiconductor device 1001 is described with reference to the drawings.

FIG. 2 is a schematic top view illustrating the semiconductor device 1001 of Embodiment 1. For example, as shown in FIG. 2, the semiconductor device 1001 is cut out of a semiconductor wafer into a quadrangular shape.

In the example shown in FIG. 2, the source wiring 52 extends in such a way as to surround the source pad 51. The gate wiring 42 is disposed between the source pad 51 and the source wiring 52 in such a way as to divide them from each other. Note, however, that, in order for the source wiring 52 and the source pad 51 to be electrically connected to each other, the gate wiring 42 is not formed, for example, in a connection region 43 connecting the source pad 51 and the source wiring 52 to each other. As illustrated, the source pad 51 may be divided into two or more parts. Part of the gate wiring 42 may be disposed between the divided parts of the source pad 51.

The width of the gate wiring 42 is smaller than the width of the gate pad 41. The width of the gate wiring 42 is for example equal to or larger than the cell pitch between first unit cells and equal to or smaller than the length of each of the short sides of the gate pad 41. Although not illustrated, a passivation film having openings in parts thereof corresponding to the source pad 51 and the gate pad 41 may be disposed on the source 50 and the gate 40.

The semiconductor device 1001 includes a termination region 80 at the outer edge thereof. The termination region 80 is formed in order to maintain a high withstand voltage. The termination region 80 is formed, for example, by implanting p-type impurities into the semiconductor device 1001. Examples of a structure of the termination region 80 include an FLR (floating limiting ring), a JTE (junction termination extension), and the like. The termination region 80 is disposed, for example, in such a way as to surround the regions in which the source pad 51, the source wiring 52, the gate pad 41, and the gate wiring 42 are disposed.

The regions in the semiconductor device 1001 in which the source pad 51 and the source wiring 52 are formed are regions in which unit cells can be disposed. In this example, a region 210 below the source pad 51 and regions 201 to 205 below the source wiring 52 can be used as element regions.

In Embodiment 1, the region 210 below the source pad 51 is used as the first element region 101, which is a transistor region. In this case, some or all of the regions 201 to 205 that are adjacent to the region 210 with the gate wiring 42 interposed therebetween can be used as diode regions.

For example, the region 204 is used here as the second element region 102, which is a diode region. In this case, each of the other regions 201, 202, 203, 205 in which unit cells can be disposed may be used as a diode region, or may be used as a transistor region. For example, all of the regions 201 to 205 may be used as diode regions. Alternatively, some of the regions, e.g. the regions 203 and 205, may be used as transistor regions, and the other regions 201, 202, and 204 may be used as diode regions.

In each of the regions 201, 202, 203, and 205, unit cells and a gate common electrode that serves as the gate electrodes of these unit cells may be disposed. The respective gate common electrodes of the regions are placed at a distance from one another so that the gate common electrodes of adjacent regions do not make contact with each other. An insulating region separating one gate common electrode from another may be disposed below the gate wiring 42. The gate common electrode of each of the regions is electrically connected to either the source 50 or the gate 40. Electrically connecting a gate common electrode to the source 50 causes the unit cells including the gate common electrode to serve as diode cells, and electrically connecting a gate common electrode to the gate 40 causes the unit cells including the gate common electrode to serve as transistor cells. For example, by connecting, to the gate wiring 42, the gate common electrodes respectively disposed in the regions 203 and 205, these regions 203 and 205 may be used as transistor regions, and by connecting, to the source wiring 52, the gate common electrodes respectively disposed in the regions 201, 202, and 204, these regions 201, 202, and 204 may be used as diode regions. A backward diode current to be described later can be made larger by increasing the proportion of diode cells to transistor cells.

Next, a structure of a unit cell in the semiconductor device 1001 is described. The semiconductor device 1001 includes unit cells including first unit cells and second unit cells. In Embodiment 1, these unit cells have the same transistor structure, and can be manufactured using a common process.

Figure 3:
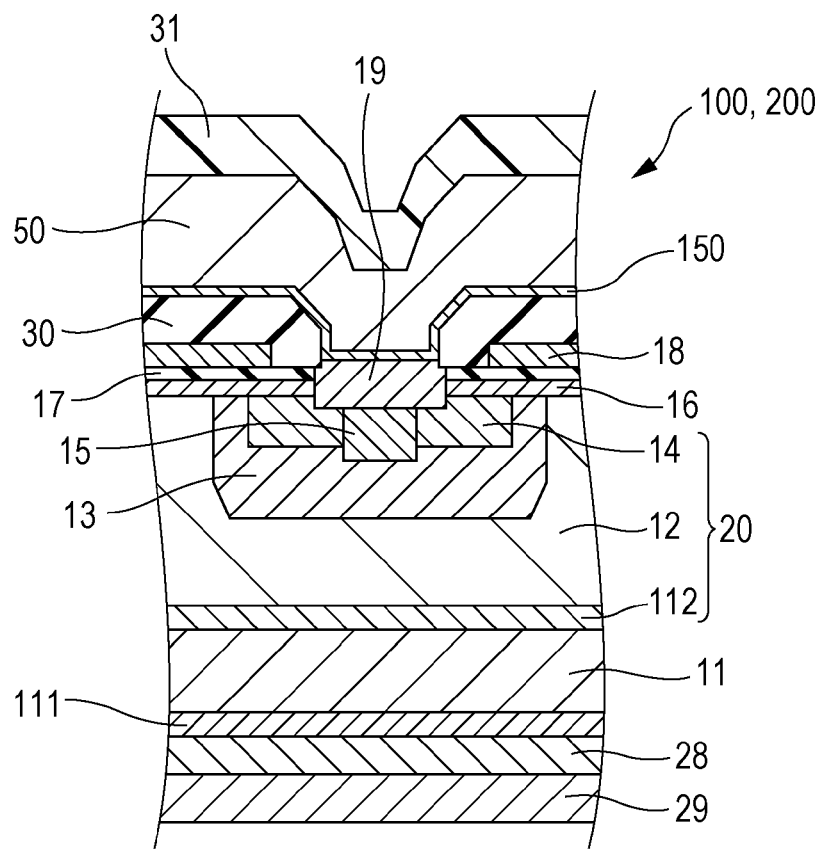
FIG. 3 is a schematic cross-sectional view showing an example of a first unit cell and a second unit cell in the semiconductor device of Embodiment 1.
Figure 4:
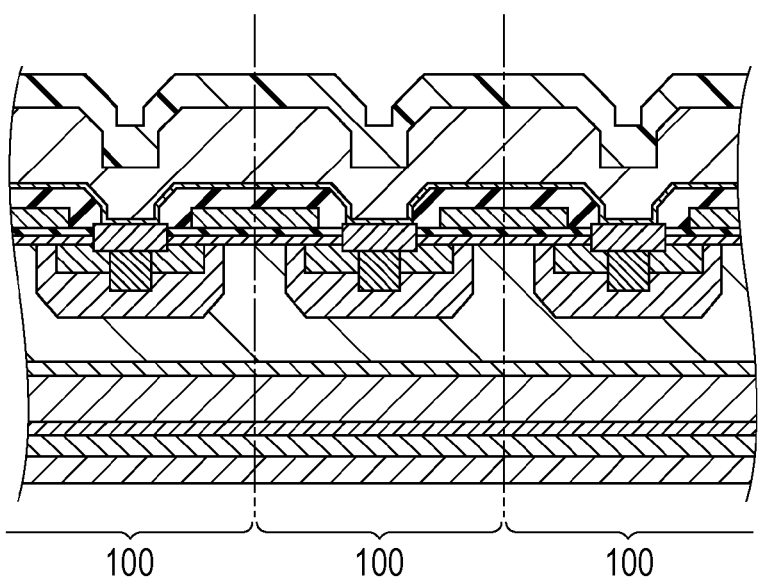
FIG. 4 is a cross-sectional view illustrating a configuration of first unit cells arranged parallel to one another in a first element region.

FIG. 3 is a schematic cross-sectional view showing an example of a first unit cell 100 and a second unit cell 200 in the semiconductor device 1001. The first unit cell 100 and the second unit cell 200 have the same cross-section structure. FIG. 4 is a cross-sectional view illustrating a configuration of first unit cells 100 arranged parallel to one another in the first element region 101. As in the configuration shown in FIG. 4, second unit cells 200 are arranged parallel to one another in the second element region 102. The following describes the cross-section structure by taking a first unit cell 100 as an example.

The first unit cell 100 includes a substrate 11 and a first silicon carbide semiconductor layer 20 of a first conductivity type located on a principal surface of the substrate 11. An example is described here in which the first conductivity type is an n type and a second conductivity type is a p type. It should be noted that the first conductivity type may be a p type and the second conductivity type may be an n type. The substrate 11 used is for example a silicon carbide substrate having $n^+$-type conductivity. The first silicon carbide semiconductor layer 20 is of an n type. The sign "+" or "−" at the upper right side of n or p conductivity represents the relative concentration of impurities. The sign "$n^+$" means a higher n-type impurity concentration than "n", and the sign "n" means a lower n-type impurity concentration than "n". One first unit cell 100 has, for example, a square shape when the semiconductor device 1001 is seen from a direction normal to the principal surface of the substrate 11. The first unit cell 100 may have a rectangular shape or a polygonal shape other than a quadrangular shape, or may be a vertically long unit cell extending in one direction.

The first silicon carbide semiconductor layer 20 includes a body region 13 of the second conductivity type located in at least part of a surface of the first silicon carbide semiconductor layer 20 and a source region 14 of the first conductivity type disposed in contact with the body region 13. The first unit cell 100 further includes a second silicon carbide semiconductor layer 16 located on upper surfaces of the source region 14 and the body region 13, a gate insulating layer 17 covering at least part of the second silicon carbide semiconductor layer 16, a gate electrode 18, a source electrode 19, and a drain electrode 28. The second silicon carbide semiconductor layer 16 functions as a channel layer. The first silicon carbide semiconductor layer 20 includes a drift region 12, which is a region of the first conductivity type in which no impurity region of the second conductivity type such as the body region 13 is formed. In Embodiment 1, the body region 13 is of a p type, and the source region 14 is of an $n^+$ type. The first silicon carbide semiconductor layer 20 may include a buffer layer 112 of the first conductivity type disposed between the substrate 11 and the drift region 12.

The second silicon carbide semiconductor layer 16 covers at least the body region 13 exposed at the surface of the first silicon carbide semiconductor layer 20 in each of the first unit cells 100. The gate insulating layer 17 is formed on the second silicon carbide semiconductor layer 16, and covers the body region 13 exposed at the surface of the first silicon carbide semiconductor layer 20, with the second silicon carbide semiconductor layer 16 disposed between the body region 13 and the gate insulating layer 17.

The gate electrode 18 is disposed above the body region 13 with the second silicon carbide semiconductor layer 16 and the gate insulating layer 17 disposed therebetween. In this example, at the surface of the first silicon carbide semiconductor layer 20, the gate electrode 18 is located above a portion of the body region 13 that is interposed between the drift region 12 and the source region 14. A channel is formed in the second silicon carbide semiconductor layer 16 disposed above the portion of the body region 13 that is interposed the drift region 12 and the source region 14.

The source electrode 19 is provided on the first silicon carbide semiconductor layer 20, and is electrically connected to the source region 14. In this example, the source electrode 19 forms an ohmic junction with the source region 14. In the body region 13, a contact region 15 of the second conductivity type may be provided. The contact region 15 has a higher impurity concentration than the body region 13. In Embodiment 1, the contact region 15 is of a p$^+$ type. The contact region 15 is in contact with the body region 13.

The source electrode 19 is disposed in such a way as to have contact with both the source region 14 and the contact region 15, and is electrically connected to both the source region 14 and the contact region 15. The source electrode 19 may form ohmic junctions with both the source region 14 and the contact region 15. It should be noted that in a case where the body region 13 has a sufficiently high impurity concentration, the contact region 15 does not need to be provided. In this case, the body region 13 and the source electrode 19 may be brought into direct contact with each other by providing the source region 14 with a contact trench through which the body region 13 is exposed and forming the source electrode 19 in the trench.

The drain electrode 28 is disposed on a back surface of the substrate 11. The back surface of the substrate 11 is a surface of the substrate 11 opposite to the surface on which the first silicon carbide semiconductor layer 20 is formed. The drain electrode 28 is electrically connected to the substrate 11. In this example, the drain electrode 28 forms an ohmic contact with the substrate 11. It should be noted that a back-surface contact region 111 of the first conductivity type may be formed on the back surface of the substrate 11 in order to reduce the contact resistance between the drain electrode 28 and the substrate 11. Further, a back-surface electrode 29 may be formed on the drain electrode 28.

In Embodiment 1, an interlayer insulating layer 30 is formed in such a way as to cover the gate electrode 18. The source 50 is provided above the interlayer insulating layer 30. The source 50 and the source electrode 19 are electrically connected to each other. The source 50 and the source electrode 19 may form an ohmic contact with each other. The source 50 is electrically connected to the source electrode 19 of each of the first unit cells 100 in a source contact hole provided in the interlayer insulating layer 30. The connection between the source 50 and the source electrode 19 is referred to as "source contact portion". As illustrated, a barrier metal layer 150 may be provided on the interlayer insulating layer 30 and in the source contact hole. The source 50 is provided above the interlayer insulating layer 30 with the barrier metal layer 150 disposed therebetween. The source 50 is connected to the source electrode 19 via the barrier metal layer 150. A passivation layer 31 may be provided on the source 50.

Figure 5A:
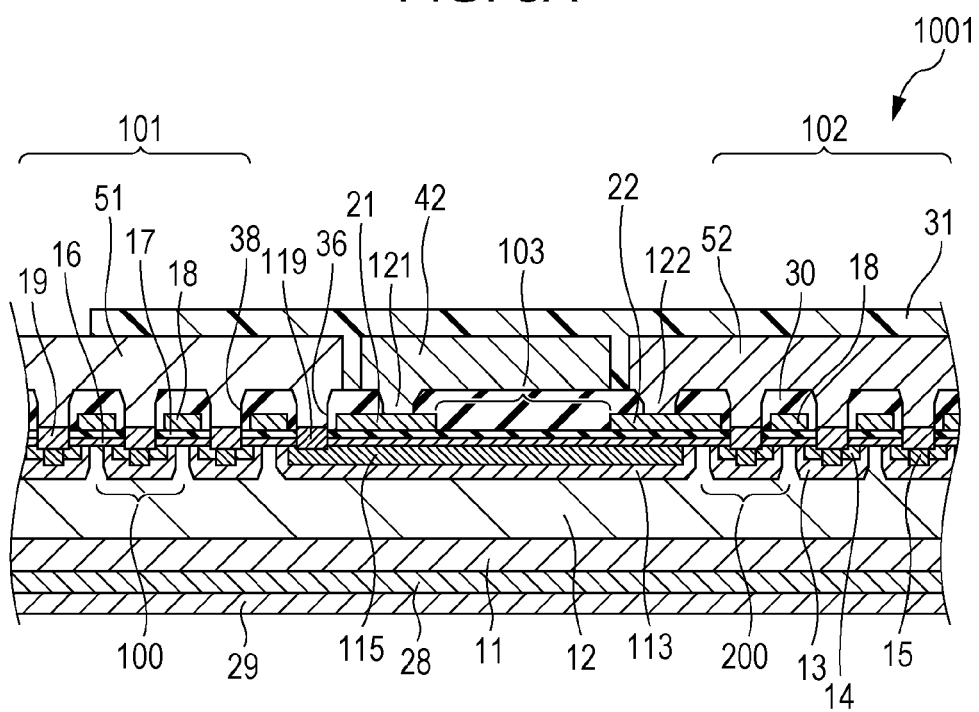
FIG. 5A is a schematic cross-sectional view of the semiconductor device of Embodiment 1.

FIG. 5A is a schematic cross-sectional view taken along the line VA-VA in FIG. 2, and shows parts of the first element region 101, the second element region 102, and the insulating region 103. For the sake of simplification of the drawing, FIG. 5A omits to illustrate the back-surface contact region 111, the buffer layer 112, the barrier metal layer 150, and the passivation layer 31, which are shown in FIG. 4.

In the cross-section shown in FIG. 5A, the source pad 51, the source wiring 52, and the gate wiring 42 are provided on the interlayer insulating layer 30. The gate wiring 42 is disposed between the source pad 51 and the source wiring 52. In Embodiment 1, the source pad 51 is disposed in the first element region 101, and the source wiring 52 is disposed in the second element region 102. No unit cells are formed below the gate wiring 42.

In the first element region 101, the first unit cells 100 are arranged parallel to one another. The first unit cells 100 are disposed, for example, under the source pad 51. The source electrode 19 of each of the first unit cells 100 is electrically connected to the source pad 51 in a source contact hole 38 provided in the interlayer insulating layer 30. In the first element region 101, the first electrode 21, which includes the gate electrodes 18 of the first unit cells 100, is disposed. In this example, the first electrode 21 extends to below the gate wiring 42, and is in direct contact with the gate wiring 42 in openings in the interlayer insulating layer 30 at first gate contact portions 121.

In the second element region 102, the second unit cells 200 are arranged parallel to one another. The second unit cells 200 are disposed, for example, under the source wiring 52. In the second element region 102, the second electrode 22, which includes the gate electrodes 18 of the second unit cells 200, is disposed. In this example, the second electrode 22 is in direct contact with the source wiring 52 in openings in the interlayer insulating layer 30 at second gate contact portions 122. Therefore, the potential of the gate electrode 18 of each of the second unit cells 200 is equal to the potential of the source electrode 19 of that second unit cell 200.

A unit cell whose gate electrode 18 is not electrically connected to the gate 40 is herein referred to as "diode cell". In Embodiment 1, the potential of the gate electrode 18 of a diode cell is equal to the potential of the source electrode 19 of the diode cell. Since the potential of the gate electrode 18 is fixed, the diode cell does not operate as a transistor. However, appropriate selection of the concentration of the body region 13, the concentration and thickness of the second silicon carbide semiconductor layer 16, and the like enables the diode cell to function as a unipolar channel diode. The unipolar channel diode will be described later.

The first electrode 21 and the second electrode 22 are not in direct contact with each other, and are disposed in such a way as to be separated from each other by the insulating region 103 below the gate wiring 42. The insulating region 103 may be constituted by the interlayer insulating layer 30. In this example, the first electrode 21 and the second electrode 22 are formed by patterning of the same conductive film. The interlayer insulating layer 30 is disposed in such a way as to cover an end of the first electrode 21 and an end of the second electrode 22.

Further, a second-conductivity-type region 113 is disposed in the first silicon carbide semiconductor layer 20 below the gate wiring 42. The second-conductivity-type region 113 is provided in order to ensure a withstand voltage. The second-conductivity-type region 113 may include a contact region 115 of the second conductivity type on a surface side of the first silicon carbide semiconductor layer 20. When seen in a plan view, at least part of the insulating region 103 may overlap the second-conductivity-type region 113. This makes it possible to dispose the insulating region 103 without reducing the element regions.

The second-conductivity-type region 113 may extend in such a way as to connect the first element region 101 and the second element region 102 to each other as seen from the direction normal to the principal surface of the substrate 11. By the second-conductivity-type region 113 being connected to at least either the source pad 51 or the source wiring 52, the potential of the second-conductivity-type region 113 may be fixed at the potential of the source 50. For example, the second-conductivity-type region 113 may be electrically connected to the source pad 51 or the source wiring 52 via contact electrodes 119 formed from the same conductive film as the source electrodes 19. In the cross-section shown in FIG. 5A, a contact electrode 119 is disposed in a contact hole 36 formed in the interlayer insulating layer 30 between the first element region 101 and the insulating region 103, and has contact with the second-conductivity-type region 113. The second-conductivity-type region 113 is electrically connected to the source pad 51 via the contact electrode 119. It should be noted that a connection between the second-conductivity-type region 113 and the source wiring 52 or the source pad 51 is herein referred to as "body contact portion". Further, a contact hole 36 in which a body contact portion is formed is referred to as "body contact hole". As will be described later with reference to FIGS. 5B and 5C, a body contact portion may be provided between the second element region 102 and the insulating region 103, as well as between the first element region 101 and the insulating region 103.

Figure 5B:
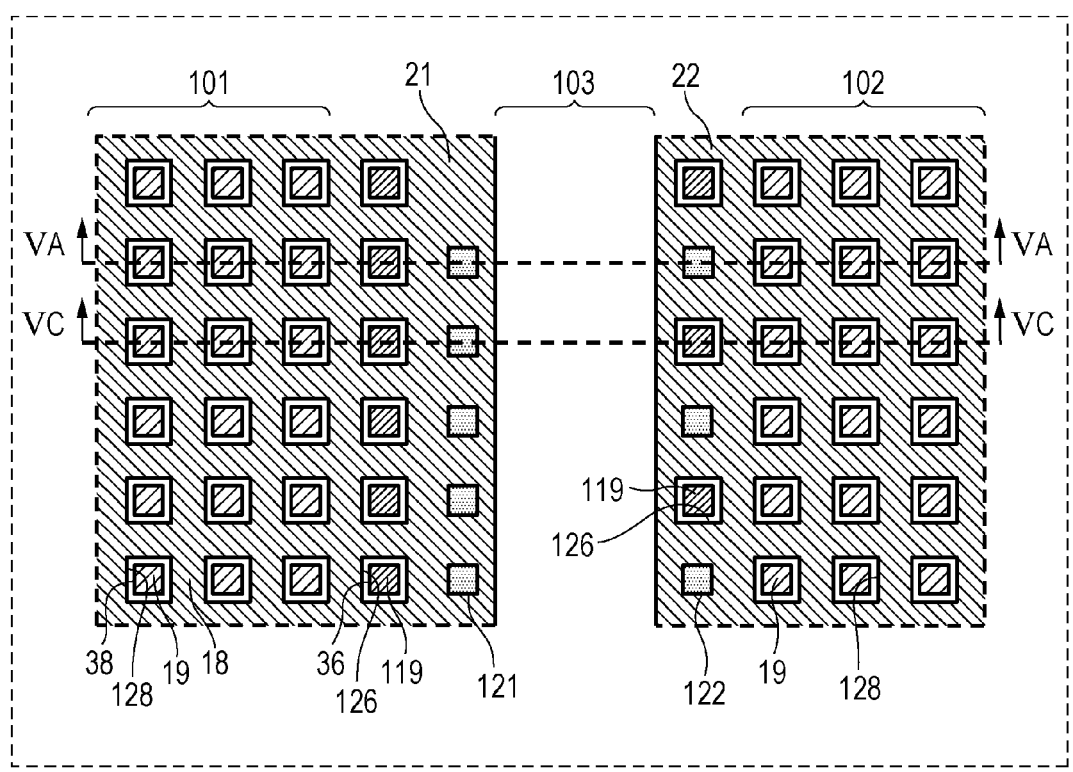
FIG. 5B is a top view for explaining a positional relationship between a first electrode, a second electrode, and contact portions in the semiconductor device of Embodiment 1.
Figure 5C:
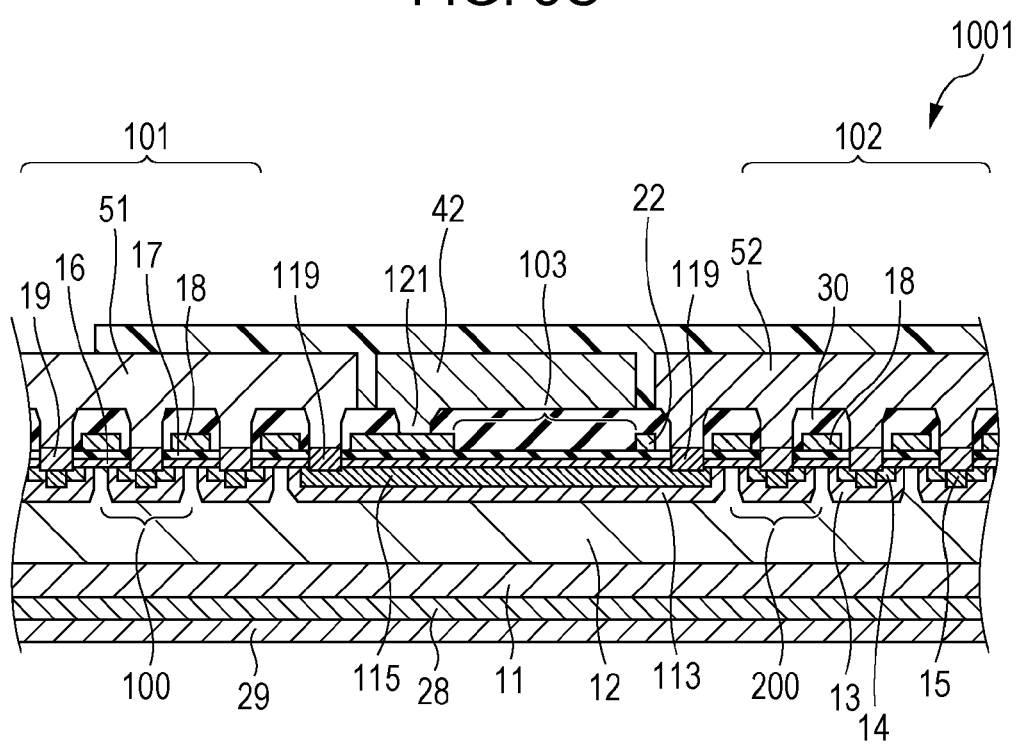
FIG. 5C is a schematic cross-sectional view of the semiconductor device of Embodiment 1.

FIG. 5B is a top view for explaining a positional relationship between the first electrode 21, the second electrode 22, first gate contact portions 121, second gate contact portions 122, and body contact portions. For the sake of simplicity, FIG. 5B shows only the first electrode 21, the second electrode 22, the source electrodes 19, and contact electrodes 119. FIG. 5C is a cross-sectional view taken along the line VC-VC in FIG. 5B. FIG. 5A corresponds to the cross-section taken along the line VA-VA in FIG. 5B.

As shown in FIG. 5B, the first electrode 21 and the second electrode 22 are separated from each other by the insulating region 103, and are not in direct contact with each other.

In the first element region 101, the first electrode 21 has openings 128 formed therein. In each of the openings 128, the source electrode 19 of the corresponding one of the first unit cells 100 is disposed. The first electrode 21 and the source electrode 19 is divided from each other by the interlayer insulating layer 30. In the openings 128 of the first electrode 21, source contact portions connecting the source electrodes 19 of the first unit cells 100 and the source 50 to each other are formed. Such opening 128 are herein referred to as "source contact openings". Similarly, in the second element region 102, the second electrode 22 has openings 128 formed therein. In each of the openings 128, a source contact hole 38 and the source electrode 19 of the corresponding one of the second unit cells 200 are disposed to form a source contact portion.

In a region of the first electrode 21 that is closer to the insulating region 103 than the first element region 101, openings 126 and first gate contact portions 121 are formed. The first electrode 21 is connected to the gate wiring 42 at the first gate contact portions 121. In each of the openings 126, a body contact hole 36 and a contact electrode 119 are disposed. The first electrode 21 and the contact electrode 119 are divided from each other by the interlayer insulating layer 30. Body contact portions are formed in these openings 126. Such openings 126 are herein referred to as "body contact openings".

In a region of the second electrode 22 that is closer to the insulating region 103 than the second element region 102, body contact openings 126 and second gate contact portions 122 are formed. The second electrode 22 is connected to the source wiring 52 at the second gate contact portions 122. In the body contact openings 126, contact electrodes 119 constituting body contact portions are disposed. As shown in FIG. 5C, in the body contact portions, the source wiring 52 and the second-conductivity-type region 113 are electrically connected to each other via the contact electrodes 119.

It should be noted that, in FIG. 5B, the first gate contact portions 121, the second gate contact portions 122, the source contact openings 128, and the body contact openings 126 are all indicated by quadrangular shapes, but these shapes are not limited to such quadrangular shapes.

In the example shown in FIG. 5B, in a plan view of the first electrode 21, the first gate contact portions 121 and the body contact openings 126 are arranged in lines, respectively, parallel to the edge of the first electrode 21 that faces the insulating region 103. Furthermore, in a plan view of the second electrode 22, the second gate contact portions 122 and the body contact openings 126 are alternately arranged parallel to the edge of the second electrode 22 that faces the insulating region 103. It should be noted that the arrangements, numbers, and the like of the first gate contact portions 121, the second gate contact portions 122, and the body contact openings 126 are not limited to the example shown in FIG. 513. For example, the source wiring 52 does not need to be electrically connected to the second-conductivity-type region 113. That is, the body contact openings 126 do not need to be provided in the second electrode 22. Furthermore, the second electrode 22 does not need to be electrically connected to the source wiring 52. For example, the second electrode 22 does not need to have the second gate contact portions 122, and may be in a floating state.

Figure 6:
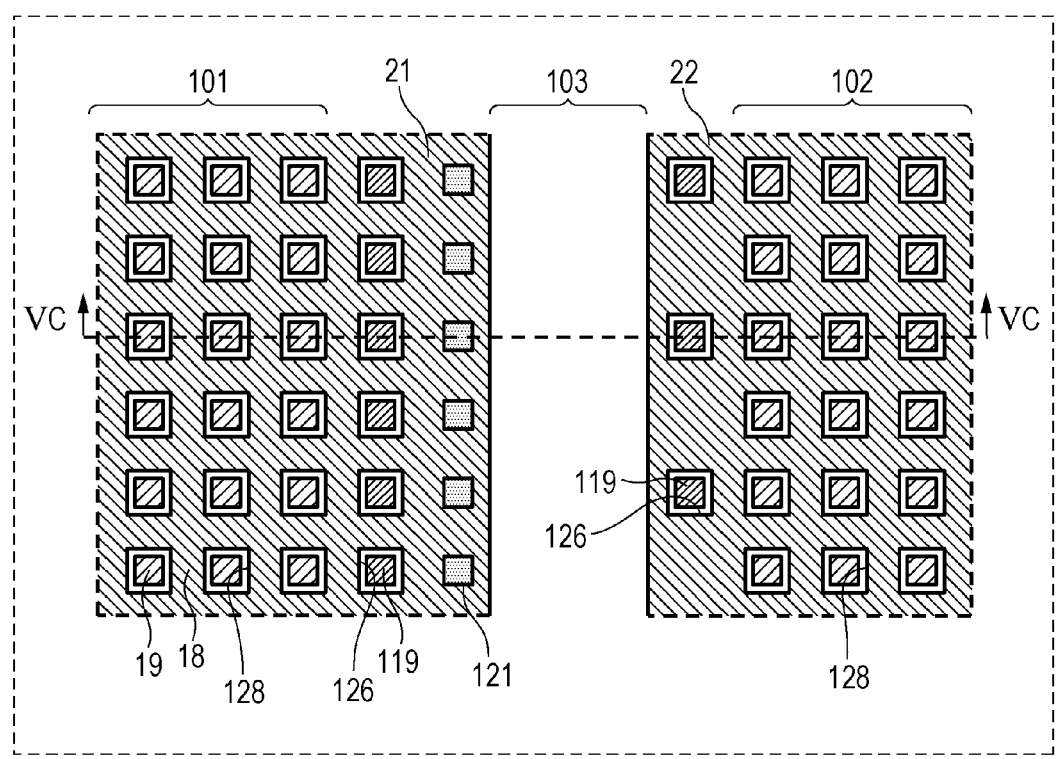
FIG. 6 is a top view for explaining another example of a positional relationship between a first electrode, a second electrode, and contact portions in the semiconductor device of Embodiment 1.

FIG. 6 is a top view showing another example of the first electrode 21 and the second electrode 22 in the semiconductor device of Embodiment 1. The cross-section taken along the line VC-VC in FIG. 6 has the same structure as FIG. 50. In the example shown in FIG. 6, the second electrode 22 has no second gate contact portions 122, nor is it connected to the source 50 or the gate 40. Even in such a case where the second electrode 22 is not subjected to an electric potential, the second unit cells 200 function as diode cells.

The semiconductor device 1001 of Embodiment 1 has the gate wiring 42 in addition to the gate pad 41. A reason for this is as follows:

A power element in which a wide-gap semiconductor such as silicon carbide is used is required to allow passage of a large current of, for example, 10 A or larger. An increase in element area makes it possible to achieve a MISFET that allows passage of a larger current. In the MISFET, a switching operation is achieved by supplying a gate signal through the gate pad to the gate electrodes disposed in the respective unit cells. In Embodiment 1, the gate wiring 42 connected to the gate pad 41 is provided in addition to the gate pad 41. This makes it possible to transmit a gate signal without delay to all of the first unit cells 100 disposed in the MISFET. That is, providing the gate wiring 42 makes it possible to achieve a MISFET that reduces gate signal delays and allows passage of a large current.

The following describes how the semiconductor device 1001 operates.

The semiconductor device 1001 includes transistor cells including the first unit cells 100 and diode cells including the second unit cells 200. The following describes an example in which the first conductivity type is an n type and the second conductivity type is a p type.

In each of the transistor cells and diode cells, the gate electrode 18, the gate insulating layer 17, and the n-type second silicon carbide semiconductor layer 16 form a MOS structure. Further, the source electrode 19 forms an ohmic junction with the n-type source region 14. Note here that appropriate selection of the impurity concentration of the p-type body region 13, the thickness and impurity concentration of the n-type second silicon carbide semiconductor layer 16, the film thickness and dielectric constant of the gate insulating layer 17, and the material or work function of the first electrode 21 allows both the transistor cells and the diode cells to function as diodes. That is, it is possible to cause each of the transistor cells to operate as a diode that allows passage of a unipolar current from the source electrode 19 to the drain electrode 28 through the second silicon carbide semiconductor layer 16 in a case where, while a threshold voltage Vth of a transistor is maintained positive, the potential Vgs of the gate electrode 18 based on the potential of the source electrode 19 is lower than the threshold voltage Vth. A diode that operates in this manner is herein referred to as "channel diode". On the other hand, a p-n junction diode formed by the drift region 12 and the body region 13 of the semiconductor device 1001 is referred to as "body diode".

More specifically, while holding both the impurity concentration of the body region 13 and the impurity concentration of the second silicon carbide semiconductor layer 16 high and setting the thickness of the second silicon carbide semiconductor layer 16 thin, the rising voltage of the channel diode can be set smaller than a voltage at which an electric current starts to flow through the body diode formed by the drift region 12 and the body region 13. For example, it is possible to cause the rising voltage of the channel diode to be equal to or lower than 1 V. The term "rising voltage" as used herein means a voltage between the source electrode and the drain electrode that is needed to pass an electric current of 1 mA in absolute value through the channel diode.

For example, application of a voltage of approximately −1 to −2 V to the drain electrode 28 with the gate electrode 18 and the source electrode 19 at 0 V allows an electric current to flow from the source electrode 19 side toward the drain electrode 28 via the n-type second silicon carbide semiconductor layer 16, the n-type first silicon carbide semiconductor layer 20, and the n-type semiconductor substrate 11. Note here that the body diode composed of the p-type body region 13 and the n-type drift region 12 is also present between the source electrode 19 and the drain electrode 28. Prior to the flow of an electric current through the p-n junction of the body diode, a unipolar current flows via the n-type second silicon carbide semiconductor layer 16, the n-type drift region 12, and the n-type semiconductor substrate 11.

Thus, the semiconductor device 1001 has a configuration in which a body diode and a channel diode are contained parallel to each other. In a case where the body region 13 and the drift region 12 are constituted by 4H—SiC, a p-n junction diode made of 4H—SiC is formed as a body diode.

First, an operation of causing the semiconductor device 1001 to function as a MISFET is described.

A positive voltage of, for example, 1 to 2 V is applied to the back-surface electrode 29 with the source pad 51 at 0 V. At this point in time, application of a voltage of, for example, 20 V to the gate pad 41 causes the semiconductor device 1001 to be turned on, whereby an electric current flows in a direction from the back-surface electrode 29 to the source pad 51. At this point in time, since the voltage applied to the gate pad 41 propagates through the first electrode 21 of the transistor cells, the transistor cells function as transistors, allowing passage of an on-state current. Thus, in a case where Vgs is equal to or higher than the threshold voltage Vth, an electric current flows from the back-surface electrode 29 to the source electrode 19 via the second silicon carbide semiconductor layer 16. Meanwhile, in each of the diode cells, the voltage applied to the gate pad 41 does not propagate through the gate electrode 18, as the gate electrode 18 is not electrically connected to the gate pad 41. In a case where the gate electrode 18 of the diode cell is connected to the source wiring 52, the diode cell does not allow passage of an on-state current as a transistor, as the voltage of the gate electrode 18 is 0 V.

Next, an operation of causing the semiconductor device 1001 to function as a diode is described.

In general, a MISFET that is used as a power element is used in combination with a diode element connected in antiparallel to the MISFET. For example, in a case where the MISFET and the diode element are applied to an inverter, the diode is used to pass a freewheeling current when the MISFET is in an off state. It is only necessary to apply a voltage of, for example, 0 V to the gate pad to turn off the MISFET. However, a negative voltage may be applied to the gate pad so that the MISFET is falsely turned on due to the influence of external noise or the like. For example, a voltage of −5 V is applied to the gate pad.

In Embodiment 1, the aforementioned diode element is not needed, as the semiconductor device 1001 has the diode cells therein. The following explains a result of comparison between the current-voltage characteristics of a MISFET of a comparative example that contains no diode cells and the current-voltage characteristics of a MISFET of an example that has diode cells contained therein.

Figure 7A:
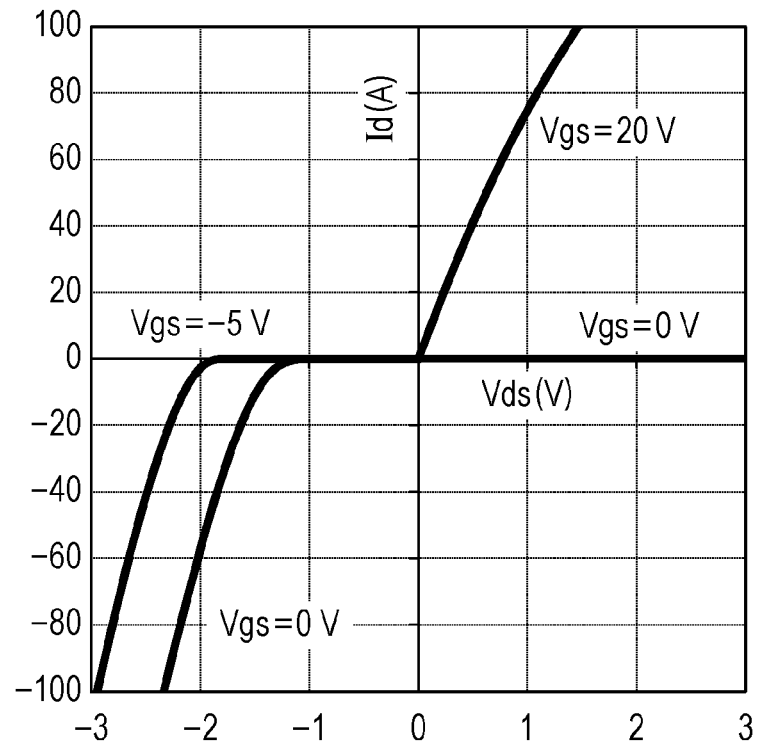
FIG. 7A is a diagram showing the current-voltage characteristics of a MISFET of a comparative example that contains no diode cells.

FIG. 7A is a diagram showing the current-voltage characteristics of a MISFET of a comparative example that contains no diode cells. The first quadrant of FIG. 7A represents current-voltage characteristics of transistor characteristics, where Vgs is equal to 0 V and 20 V. The third quadrant represents current-voltage characteristics of diode characteristics, where Vgs is equal to 0 V and −5 V.

A negative voltage (e.g. −1 to −2.5 V) is applied to the back-surface electrode with the source pad at 0 V. At this point in time, the setting of the voltage Vgs of the gate pad at 0 V causes the MISFET to function as a diode, whereby an electric current flows in a direction from the source pad to the back-surface electrode. At this point in time, since the potentials of the gate electrodes of the transistor cells become equal to the potential of the gate pad, the transistor cells function as diodes, allowing passage of a unipolar current.

It is known that, in a p-n diode having a p-n junction made of 4H—SiC, the flow of a bipolar current is started by applying a forward voltage of approximately 2.5 V at room temperature. The electric current that starts to flow is herein defined, for example, as 1 mA. However, in the MISFET of the comparative example, an electric current flows from a forward voltage of 1 V or lower, i.e. a voltage of −1 V or higher on the graph of FIG. 7A. This electric current is considered not as a bipolar current having passed through the p-n junction, but as a unipolar current flowing via a channel. It should be noted that application of a negative voltage of, for example, −4 V to the back-surface electrode 29 causes an electric current to flow through the body diode, too. In this case, a bipolar current, as well as the unipolar current, flows.

In the MISFET of the comparative example, the absolute value of a diode current is lower when the gate voltage Vgs is −5 V than when the gate voltage Vgs is 0 V. This is because a change in the gate voltage Vgs from 0 V to −5 V raises an electric potential at the interface between the gate insulating layer 17 and the second silicon carbide semiconductor layer 16, resulting in a higher potential barrier as seen from the source electrode 19, and by extension in a decrease in the absolute value of the diode current.

Figure 7B:
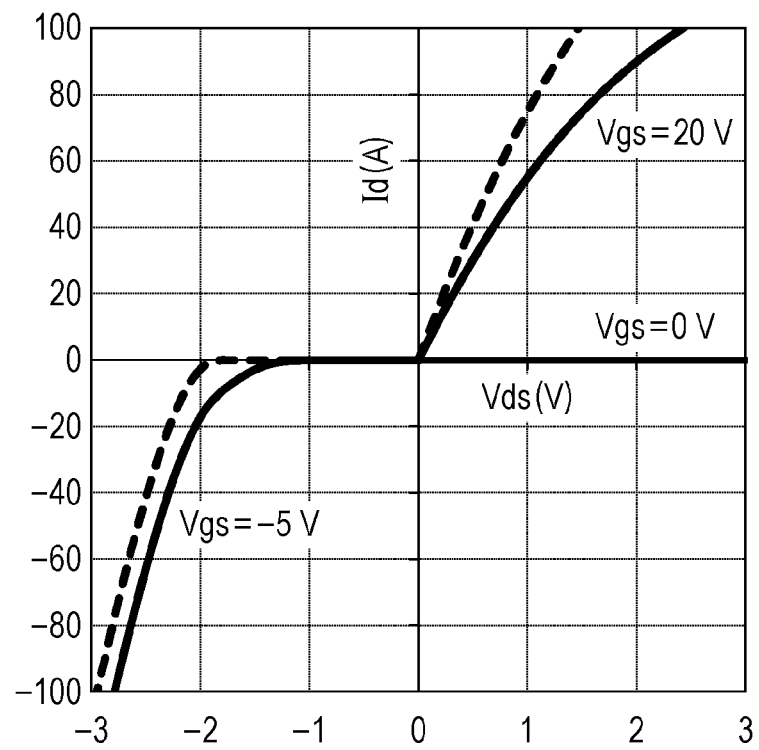
FIG. 7B is a diagram showing the current-voltage characteristics of a MISFET of an example that contains diode cells.

FIG. 7B is a diagram showing a result obtained by simulation of the current-voltage characteristics of a MISFET of an example that contains diode cells. For comparison, the transistor characteristics of the MISFET of the comparative example at Vgs=20 V and the diode characteristic thereof at Vgs=−5 V are indicated by dashed lines in FIG. 7B.

As can be seen from the result shown in FIG. 7B, in a case where a forward voltage, i.e. a voltage that is positive to the back-surface electrode 29 with respect to the source pad 51, is applied, a smaller on-state current flows through the transistor as much as the diode cells are contained than in the comparative example. Meanwhile, in a case where a backward voltage, i.e. a voltage that is negative to the back-surface electrode 29 with respect to the source pad 51, is applied, the absolute value of the diode current becomes bigger as much as the diode cells are contained than in the comparative example. A reason for this is as follows:

In each of the diode cells, the gate electrode 18, which is part of the second electrode 22, is not electrically connected to the gate pad 41, but is for example electrically connected to the source wiring 52. For this reason, the potential of the gate electrode 18 is different from the potential of the gate pad 41, and the voltage of the gate electrode 18 becomes 0 V. There is no change in the electric potential at the interface between the gate insulating layer 17 and the second silicon carbide semiconductor layer 16, nor is there any change in the potential barrier as seen from the source electrode 19. Therefore, in a case where a negative voltage is applied to the gate pad 41, the diode cells become larger in the absolute value of the diode current than the transistor cells. As a result of this, in the example, the absolute value of the diode current is bigger than the diode characteristics of the MISFET of the comparative example. Meanwhile, the on-state current is smaller than the transistor characteristics of the MISFET of the comparative example, as the diode cells do not function as transistors even when a positive voltage is applied to the gate pad 41.

The ratio of the aforementioned decrease in transistor current to the aforementioned increase in diode current varies according to the area ratio R of the area of diode regions to the area of all of the element regions in a case where the diode cells and the transistor cells are placed at equal cell pitches. The area ratio R is expressed as D/(T+D), where T is the total area of transistor regions in the semiconductor device 1001 and 0 is the total area of diode regions in the semiconductor device 1001.

Still referring to FIG. 2, an example of a method for controlling the area ratio R is described. In the example shown in FIG. 2, the region 210 in which the source pad 51 is disposed is used as the first element region 101, which is a transistor region, the area ratio R can be selected according to how many of the regions in which diode cells can be disposed, which are here the regions shown as the regions 201 to 205, are used as diode cell regions.

Let it be assumed here that $S_{210}$ is the area of the region 210 located below the source pad 51, that $S_{201}$, $S_{202}$, $S_{203}$, $S_{204}$, and $S_{205}$ are the areas of the regions 201 to 205, respectively, and that the ratio of these areas is $S_{210}:S_{201}:S_{202}:S_{203}:S_{204}:S_{205}=50:2:2:5:4:5$. The region 210 is a transistor region in which the first unit cells, which are transistor cells, are disposed. As mentioned above, the regions 201 to 205 can be used both as transistor regions and diode regions, depending on whether the gate common electrodes are connected to the gate 40.

As one example, when only the region 201 of the regions in which diode cells can be disposed is used as a diode region and transistor cells are disposed in the other regions 202 to 205, the area ratio R is approximately 0.03 as indicated by the following equation:

$$R=D/(T+D)=S_{201}/(S_{210}+S_{201}+S_{202}+S_{203}+S_{204}+S_{205})=2/(50+2+2+5+4+5)\approx 0.03$$

Alternatively, when all of the regions in which diode cells can be disposed, namely the regions 201 to 205, are used as diode regions, the area ratio is approximately 0.26 as indicated by the following equation:

$$R=D/(T+D)=(S_{201}+S_{202}+S_{203}+S_{204}+S_{205})/(S_{210}+S_{201}+S_{202}+S_{203}+S_{204}+S_{205})=(2+2+5+4+5)/(50+2+2+5+4+5)\approx 0.26$$

Thus, the area ratio R can be changed with a high degree of freedom depending on whether to dispose diode cells or transistor cells in the regions 201 to 205. Controlling the area ratio R makes it possible to adjust a forward transistor current and a backward diode current.

Figure 8:
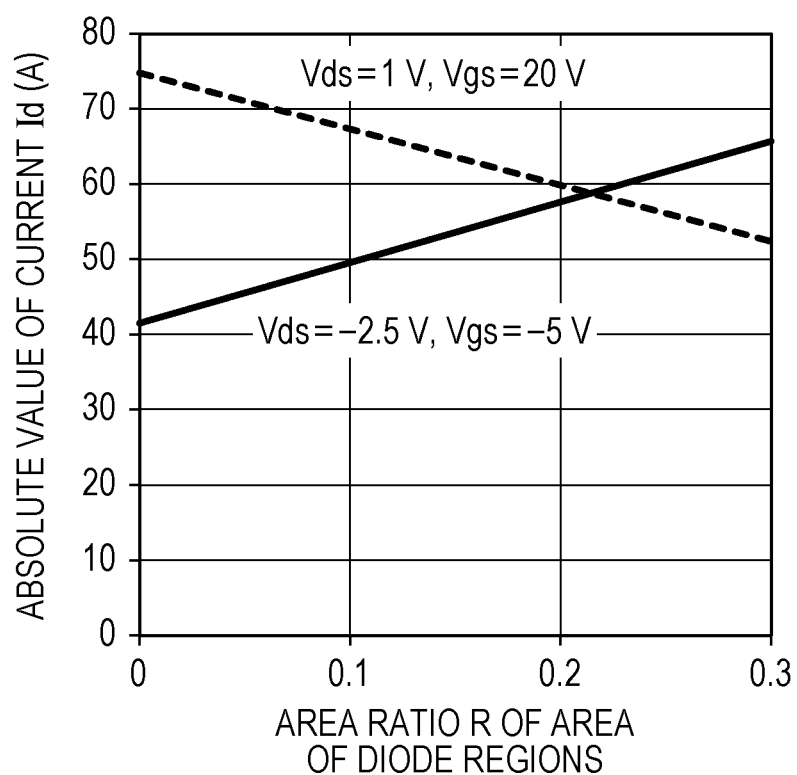
FIG. 8 is a diagram illustrating a relationship between the area ratio R of the area of diode regions to the area of all of the element regions and the absolute values of a forward transistor current and a backward diode current.

FIG. 8 is a diagram illustrating a relationship between the area ratio R of the area of diode regions to the area of all of the element regions and the absolute values of a forward transistor current at Vgs=20 V and a backward diode current at Vgs=−5 V. A forward transistor current at the time of application of 1 V to the back-surface electrode, i.e. at Vds =1 V. is indicated by a dashed line, and a backward diode current at the time of application of −2.5 V to the back-surface electrode, i.e. at Vds=−2.5 V, is indicated by a solid line. It is confirmed from the graph illustrated in FIG. 8 that controlling the area ratio R makes it possible to change the ratio of the forward current to the backward current without significantly changing the size or configuration of the semiconductor device 1001. It should be noted that although Vgs at which the backward diode current is obtained is −5 V in the example of FIG. 8, this does not imply any limitation. The backward diode current may be increased or decreased by changing the value of Vgs.

<Method for Manufacturing Semiconductor Element 1001>

Next, an example of a method for manufacturing a semiconductor device 1001 of Embodiment 1 is described in detail with reference to the drawings. Specific numerical values, materials, and process conditions that are described below are merely examples.

Each of FIGS. 9A, 9B, 10A, 10B, 11A, 11B, 12A, 12B, 13A, 13B, 14A, 14B, 15A, 15B, 16A, and 16B is a cross-sectional view for explaining the method for manufacturing a semiconductor device 1001, and shows a cross-section structure taken along the line VA-VA in FIG. 2.

First, a substrate 11 is prepared. The substrate 11 is for example a low-resistance n-type 4H—SiC offcut substrate having a resistivity of approximately 0.02 Ω cm.

Figure 9A:
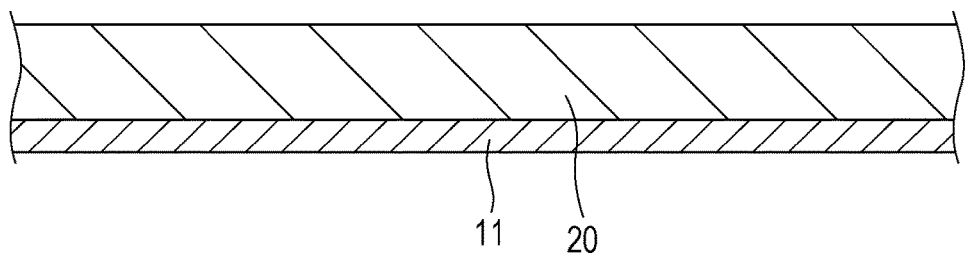
FIG. 9A is a cross-sectional view for explaining a method for manufacturing a semiconductor device of Embodiment 1.

As shown in FIG. 9A, a high-resistance n-type first silicon carbide semiconductor layer 20 is formed on the substrate 11 by epitaxial growth. Prior to the formation of the first silicon carbide semiconductor layer 20, a buffer layer 112 made of n-type SiC having a high impurity concentration may be deposited on the substrate 11. The impurity concentration of the buffer layer 112 is for example $1\times10^{18}$ cm$^{-3}$, and the thickness of the buffer layer 112 is for example 1 μm. The first silicon carbide semiconductor layer 20 is made, for example, of n-type 4H—SiC, and has an impurity concentration of, for example, $1\times10^{16}$ cm$^{-3}$ and a thickness of, for example, 10 μm.

Figure 9B:
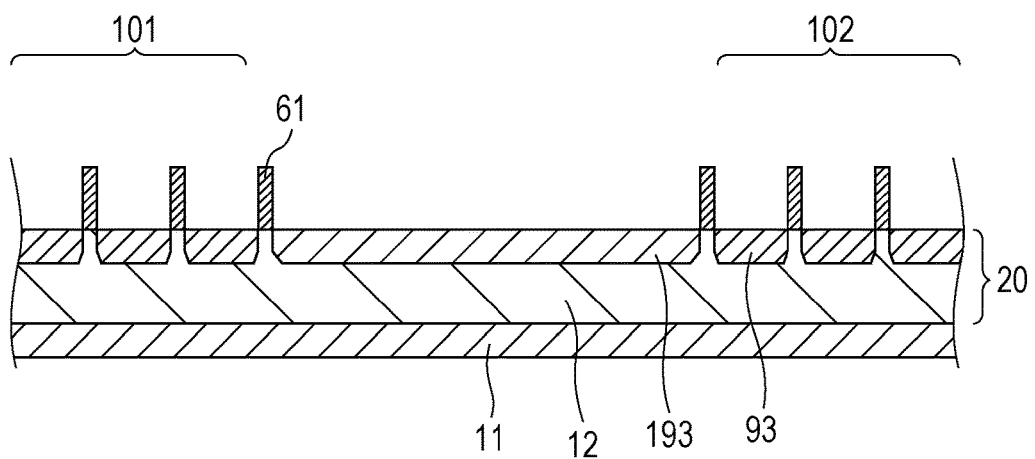
FIG. 9B is a cross-sectional view for explaining the method for manufacturing a semiconductor device of Embodiment 1.

Next, as shown in FIG. 9B, a mask 61 made, for example, of SiO$_2$ is formed on the first silicon carbide semiconductor layer 20, and for example, Al (aluminum) ions are implanted into the first silicon carbide semiconductor layer 20. This forms body implantation regions 93 and a second-conductivity-type implantation region 193. For example, the energy and dose amount of ion implantation are adjusted so that the concentration of Al ions that are implanted is approximately $2\times10^{19}$ cm$^{-3}$ and the depth of Al ions that are implanted is approximately 0.5 to 1.0 μm. The "depth" here is equivalent to the distance from a surface of the first silicon carbide semiconductor layer 20 to a place where the concentration of Al ions implanted becomes equal to the n-type impurity concentration of the first silicon carbide semiconductor layer 20. The body implantation regions 93 are disposed in a first element region 101 and a second element region 102, and define body regions 13 of first and second unit cells. The second-conductivity-type implantation region 193 is disposed in a region between the first element region 101 and the second element region 102 in which a gate wiring is to be formed. The second-conductivity-type implantation region 193 defines a second-conductivity-type region 113.

In order for the semiconductor device 1001 to function as a channel diode, the Al concentration on surfaces of the body implantation regions 93, which are to serve as the body regions 13, may be equal to or higher than $5\times10^{18}$ cm$^{-3}$ and equal to or lower than $1\times10^{20}$ cm$^{-3}$. The second-conductivity-type implantation region 193, which is to serve as the second-conductivity-type region 113, may have the same impurity concentration as the body implantation regions 93.

Figure 10A:
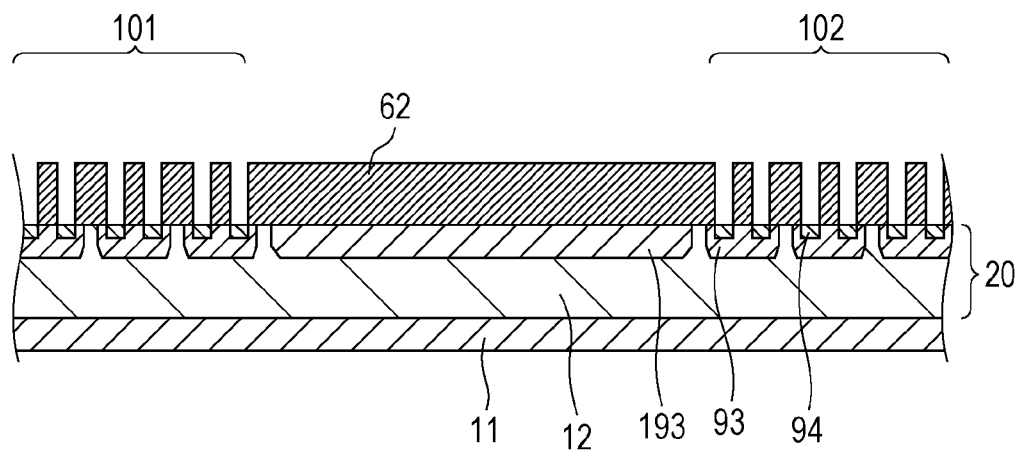
FIG. 10A is a cross-sectional view for explaining the method for manufacturing a semiconductor device of Embodiment 1.

Next, as shown in FIG. 10A, after the ion implantation, the mask 61 is removed, and a mask 62 made, for example, of SiO$_2$ is formed. The mask 62 is used to form source implantation regions 94 in the body implantation regions 93, for example, by implanting nitrogen ions into the body implantation regions 93. The ion implantation profile is adjusted so that the depth of the source implantation regions 94 is for example 250 nm and the average impurity concentration of the source implantation regions 94 is approximately $5\times10^{19}$ cm$^{-3}$. After the ion implantation, the mask 62 is removed.

It should be noted that a side wall may be formed as a mask on a lateral wall of the mask 61 by further depositing SiO$_2$ or the like and partially processing it while leaving part of the mask 61. In this case, the mask 61 and the side wall can be used as part of the mask 62. That is, the source implantation regions 94 can be formed in the body implantation regions 93 in a self-aligning manner.

Figure 10B:
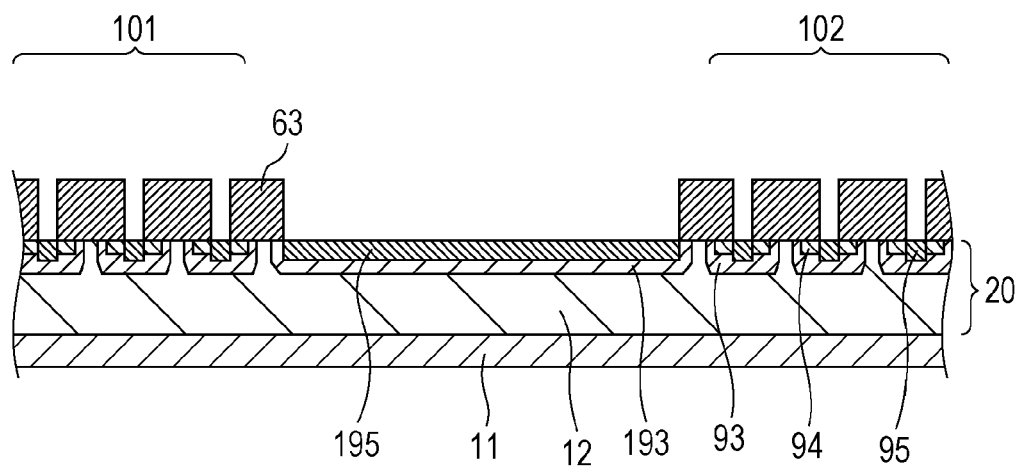
FIG. 10B is a cross-sectional view for explaining the method for manufacturing a semiconductor device of Embodiment 1.

Next, as shown in FIG. 10B, contact implantation regions 95 and 195 are formed by implanting Al into the first silicon carbide semiconductor layer 20 after having formed a mask 63. The contact implantation regions 95 are disposed in the body implantation regions 93 in such a way as to have contact with the body implantation region 93. The contact implantation region 195 is disposed in the second-conductivity-type implantation region 193 in such a way as to have contact with the second-conductivity-type implantation region 193.

The depth of the contact implantation regions 95 and 195 is for example 400 nm, and the average impurity concentration of the contact implantation regions 95 and 195 is approximately $1\times10^{20}$ cm$^{-3}$. The depth of the contact implantation regions 95 and 195 is such a depth that an impurity concentration of for example $5\times10^{17}$ cm$^{-3}$ can be attained. After this, the mask 63 is removed.

At this point in time, in the first and second unit cells, the first silicon carbide semiconductor layer 20 includes JFET regions in which none of the body implantation regions 93, the source implantation regions 94, or the contact implantation regions 95 is formed as seen from a direction normal to a principal surface of the substrate 11. Implantation regions of the first conductivity type (not illustrated) may be formed in such a way as to include the JFET regions as seen from the direction normal to the principal surface of the substrate 11. The implantation regions are formed, for example, by implanting nitrogen ions. The implantation regions may be formed to extend from the surface of the first silicon carbide semiconductor layer 20 to a place deeper than the body implantation regions 93 in a direction perpendicular to the principal surface of the substrate 11. The average impurity concentration of the implantation regions is set for example at approximately $1\times10^{17}$ cm$^{-3}$.

Furthermore, on a surface of the substrate 11 opposite to the surface on which the first silicon carbide semiconductor layer 20 is deposited, a back-surface contact implantation region (not illustrated) may be formed for the purpose of reducing contact resistance with the drain electrode 28 to be formed later. The back-surface contact implantation region serves as a back-surface contact region after the activating step to be described later. The average impurity concentration of the implantation region is set for example at approximately $5\times10^{19}$ cm$^{-3}$.

Figure 11A:
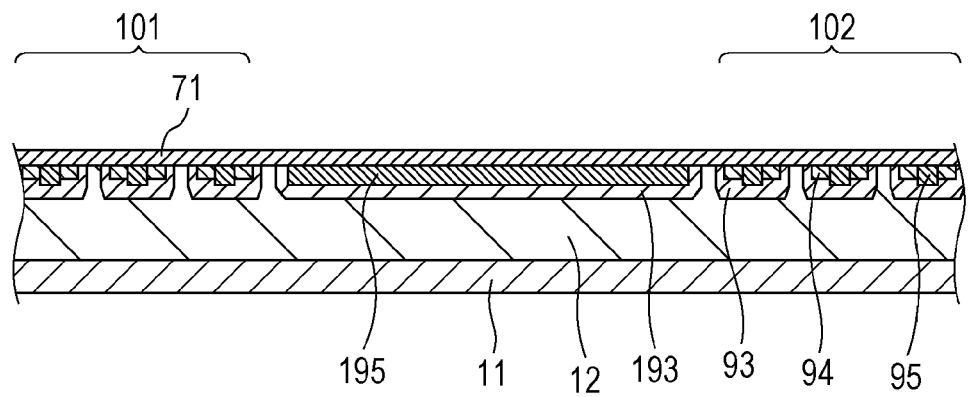
FIG. 11A is a cross-sectional view for explaining the method for manufacturing a semiconductor device of Embodiment 1.

After these ion implantations, high-temperature heat treatment is performed to activate the impurities implanted into the first silicon carbide semiconductor layer 20. The high-temperature heat treatment is also referred to as "activating annealing". For example, as shown in FIG. 11A, the high-temperature heat treatment may be performed under an inert gas atmosphere such as Ar or N$_2$ or a vacuum atmosphere in a state where a thin film 71 composed mainly, for example, of carbon is deposited by approximately 200 nm on the surface of the first silicon carbide semiconductor layer 20 subjected to ion implantation. The high-temperature heat treatment is performed, for example, for approximately 30 minutes at a temperature of approximately 1700° C. In a case where the back-surface contact region is formed, a thin film 71 may be formed on a back surface of the first silicon carbide semiconductor layer 20, too.

Figure 11B:
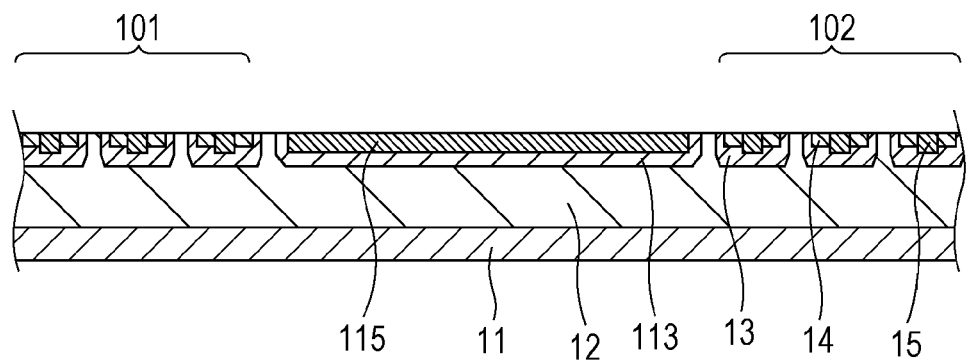
FIG. 11B is a cross-sectional view for explaining the method for manufacturing a semiconductor device of Embodiment 1.

After the high-temperature heat treatment, the thin film 71 made of carbon is removed, whereby, as shown in FIG. 11B, the body regions 13, the second-conductivity-type region 113, the contact regions 15, the contact region 115, and the source regions 14 are obtained. It should be noted that a surface layer of the first silicon carbide semiconductor layer 20 may be removed for cleaning of the surface of the first silicon carbide semiconductor layer 20 after the high-temperature heat treatment. The surface layer may be removed, for example, by a sacrificial oxidizing step of removing a thermally-oxidized film from the first silicon carbide semiconductor layer 20 after thermal oxidation of the first silicon carbide semiconductor layer 20. This causes the surface of the first silicon carbide semiconductor layer 20 to be removed, for example, by approximately 10 to 20 nm.

Figure 12A:
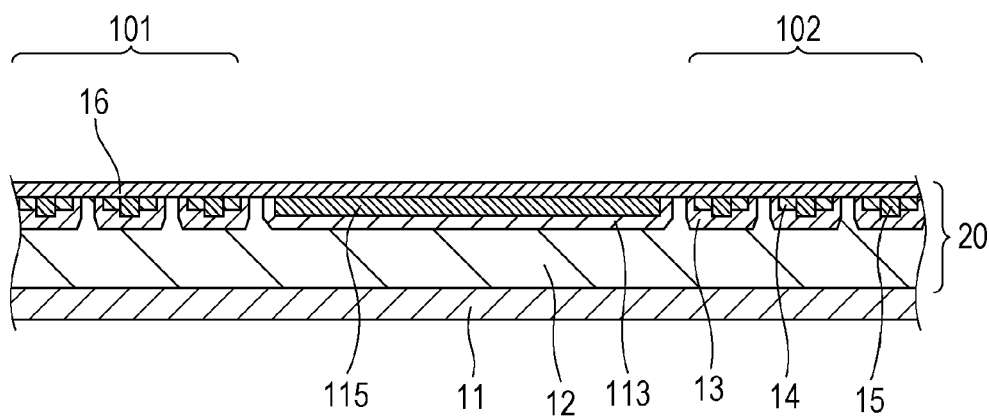
FIG. 12A is a cross-sectional view for explaining the method for manufacturing a semiconductor device of Embodiment 1.

Next, as shown in FIG. 12A, a second silicon carbide semiconductor layer 16 that is to serve as a channel layer is deposited on the surface of the first silicon carbide semiconductor layer 20. The second silicon carbide semiconductor layer 16 may be formed by epitaxial growth of SiC. The second silicon carbide semiconductor layer 16 may contain nitrogen or phosphorus as an n-type dopant. The second silicon carbide semiconductor layer 16 is deposited as much extra as the surface is removed in the subsequent gate insulating layer forming step. For example, the second silicon carbide semiconductor layer 16 is deposited by approximately 100 nm.

Figure 12B:
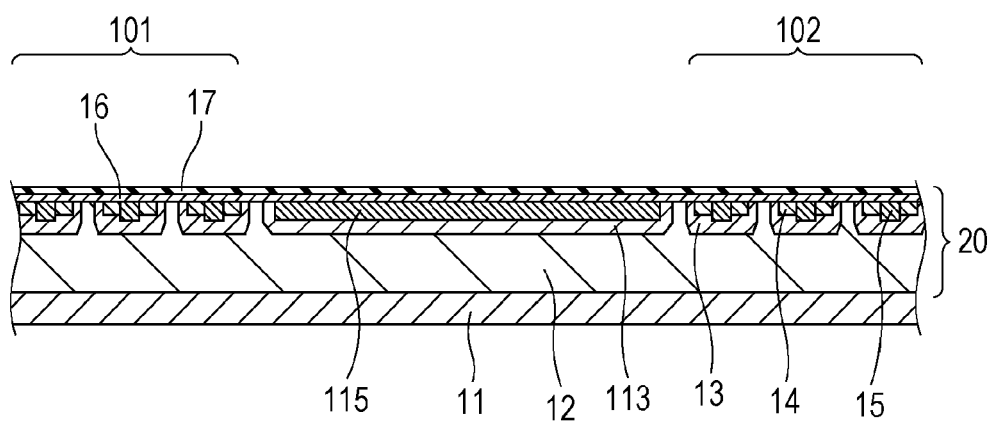
FIG. 12B is a cross-sectional view for explaining the method for manufacturing a semiconductor device of Embodiment 1.

Next, as shown in FIG. 12B, a gate insulating layer 17 is formed. In this example, the gate insulating layer 17 may be formed on a surface of the second silicon carbide semiconductor layer 16 by performing a thermal oxidizing step after having removed a surface portion of the second silicon carbide semiconductor layer 16 through sacrificial oxidization. This step causes part of the second silicon carbide semiconductor layer 16 to be removed, so that the thickness of the second silicon carbide semiconductor layer 16 becomes for example approximately 50 nm. Further, the thickness of the gate insulating layer 17 is for example 70 nm.

It should be noted that, in order for the semiconductor device 1001 to function as a channel diode, the second silicon carbide semiconductor layer 16 with the gate insulating layer 17 formed thereon may have a thickness of 20 to 60 nm and an average impurity concentration of $5 \times 10^{17}$ to $5 \times 10^{18}$ cm$^{-3}$. The average impurity concentration of the second silicon carbide semiconductor layer 16 may be smaller than that of the surfaces of the body regions 13 that are in contact with the second silicon carbide semiconductor layer 16. This enables the semiconductor device 1001 to function as a normally-off MISFET at room temperature. In a case where the gate insulating layer 17 is formed by thermal oxidization of the second silicon carbide semiconductor layer 16, the thickness of the gate insulating layer 17 may be approximately 50 to 100 nm.

Figure 13A:
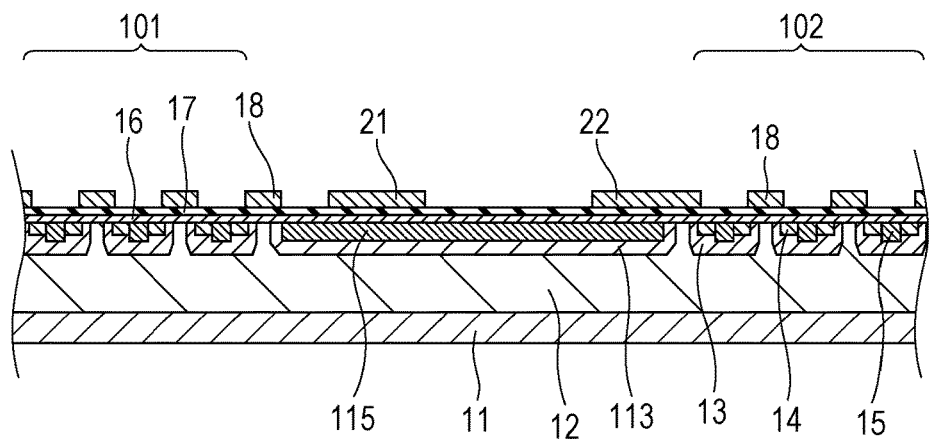
FIG. 13A is a cross-sectional view for explaining the method for manufacturing a semiconductor device of Embodiment 1.

After this, a polycrystalline silicon film doped, for example, with phosphorous by approximately $7 \times 10^{20}$ cm$^{-3}$ is deposited as a gate electrode conductive film on the gate insulating layer 17. The polycrystalline silicon film has a thickness of, for example, approximately 500 nm. Then, a mask (not illustrated) is used to dry etch the polycrystalline silicon film. According to this, as shown in FIG. 13A, a first electrode 21 that is to serve as gate electrodes 18 of the first unit cells are formed in the first element region 101, and a second electrode 22 that is to serve as gate electrodes 18 of the second unit cells are formed in the second element region 102. The first electrode 21 and the second electrode 22 are separated, for example, in the d etching step, and are not electrically connected to each other.

Figure 13B:
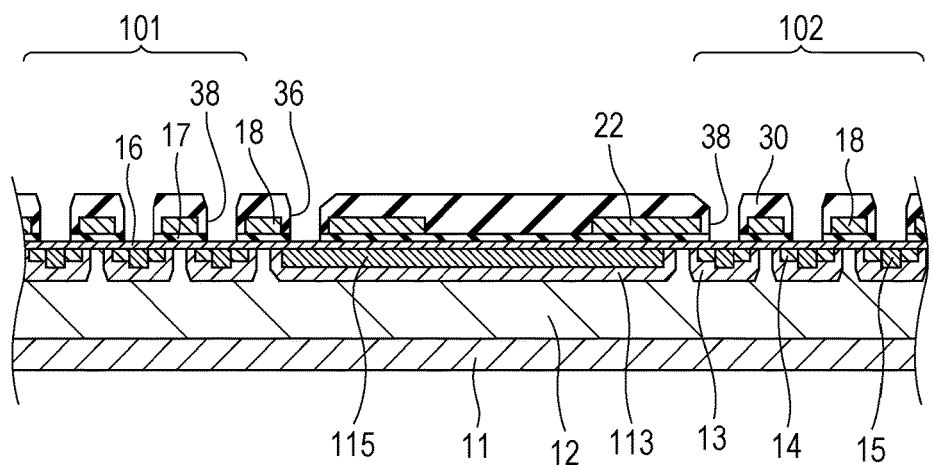
FIG. 13B is a cross-sectional view for explaining the method for manufacturing a semiconductor device of Embodiment 1.

Then, an interlayer insulating layer 30 made, for example, of SiO$_2$ is deposited by a CVD method so as to cover surfaces of the first electrode 21 and the second electrode 22 and the surface of the second silicon carbide semiconductor layer 16. The interlayer insulating layer 30 has a thickness of, for example, 1 μm. Next, a photoresist mask (not illustrated) is used to perform dry etching to remove parts of the interlayer insulating layer 30 and parts of the gate insulating layer 17 that are located above the surfaces of the contact regions 15 and the surfaces of parts of the source regions 14. According to this, as shown in FIG. 13B, body contact holes 36 and source contact holes 38 are formed in the interlayer insulating layer 30 and the gate insulating layer 17. The body contact holes 36 are disposed in such a way as to expose the contact region 115 in the second-conductivity-type region 113. The source contact holes 38 are disposed in such a way as to expose the source regions 14 and contact regions 15 of the first and second unit cells.

Figure 14A:
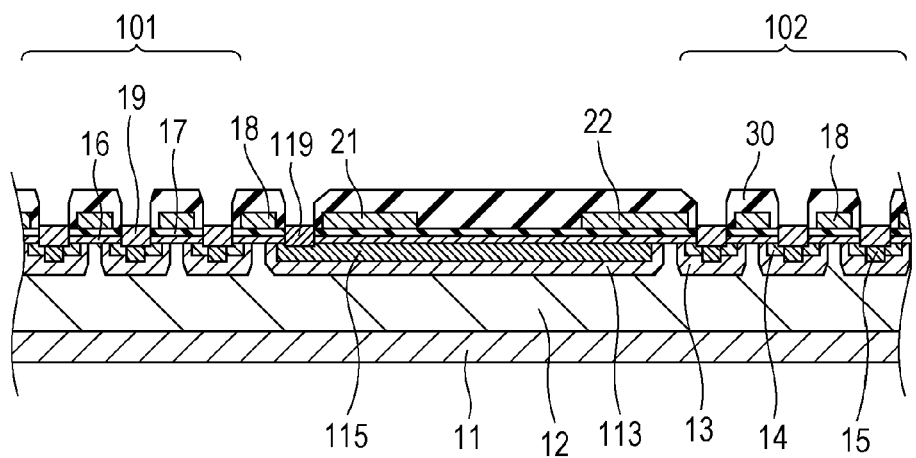
FIG. 14A is a cross-sectional view for explaining the method for manufacturing a semiconductor device of Embodiment 1.

After this, as shown in FIG. 14A, contact electrodes 119 are formed in the body contact holes 36, and source electrodes 19 are formed in the source contact holes 38. The contact electrodes 119 and the source electrodes 19 may for example contain Ni, and may be nickel silicide electrodes.

In this example, a Ni film having a thickness of, for example, approximately 100 nm is formed on the interlayer insulating layer 30, in the body contact holes 36, and in the source contact holes 38. Next, heat treatment is performed for 1 minute at a temperature of, for example, 950° C. under an inert atmosphere. This brings the Ni film and the second silicon carbide semiconductor layer 16 into reaction to give the contact electrodes 119 and the source electrodes 19, which are made of nickel silicide. Next, the Ni film on the interlayer insulating layer 30 is removed by etching. In a case where the thickness of the second silicon carbide semiconductor layer 16 is small, the silicidation of the Ni film brings the source electrodes 19 into conduction with the contact regions 15 or source regions 14 located below the second silicon carbide semiconductor layer 16. Similarly, the contact electrodes 119 are brought into conduction with the contact region 115.

Figure 14B:
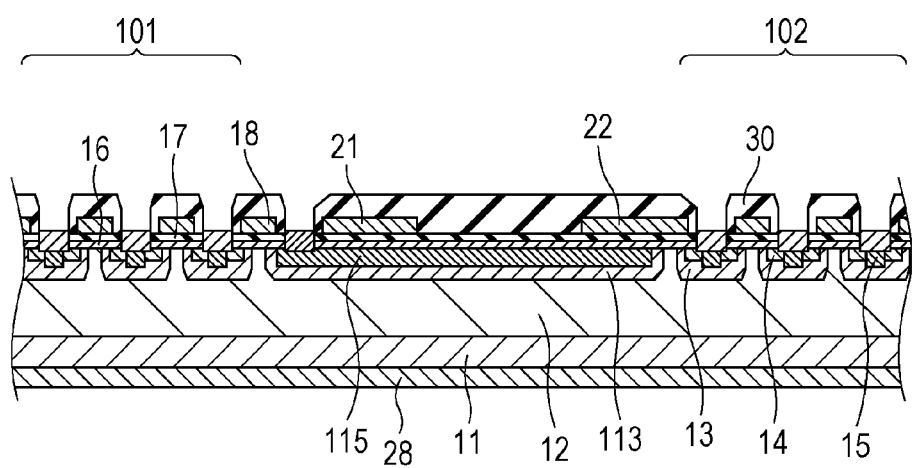
FIG. 14B is a cross-sectional view for explaining the method for manufacturing a semiconductor device of Embodiment 1.
Figure 15A:
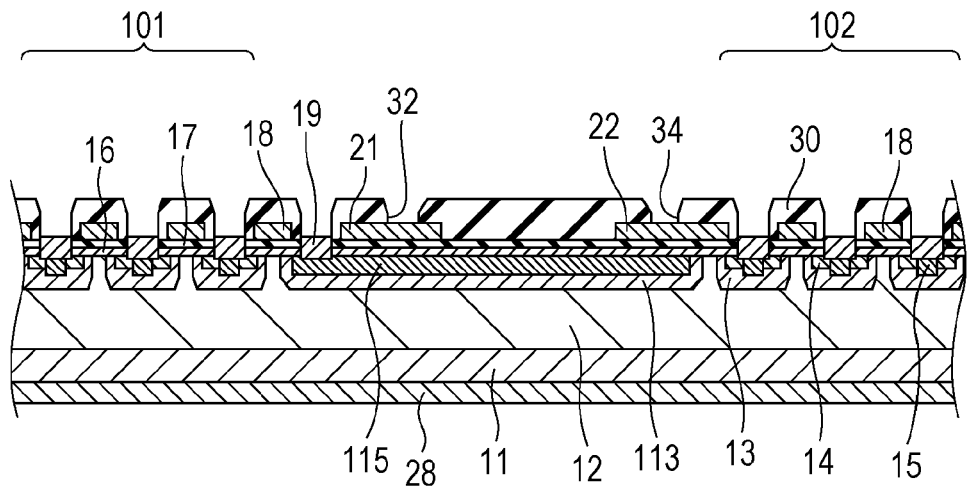
FIG. 15A is a cross-sectional view for explaining the method for manufacturing a semiconductor device of Embodiment 1.

Next, as shown in FIG. 14B, the drain electrode 28 is formed on a back surface of the substrate 11. In this example, a Ni film is deposited, for example, on the entire back surface of the substrate 11, and heat treatment similar to that described above is performed to bring the back surface of the substrate 11 and the Ni film into reaction to form the drain electrode 28, which is made of nickel silicide, Next, as shown in FIG. 15A, first gate contact holes 32 and second gate contact holes 34 are formed by etching parts of the interlayer insulating layer 30 after having forming a photoresist mask (not illustrated). The first gate contact holes 32 are disposed in such a way as to expose parts of the first electrode 21 that are located above the second-conductivity-type region 113. The second gate contact holes 34 are disposed in such a way as to expose parts of the second electrode 22 that are located above the second-conductivity-type region 113.

Then, although not illustrated, a barrier metal layer may be formed on the interlayer insulating layer 30, in the source contact holes 38, in the body contact holes 36, in the first gate contact holes 32, and in the second gate contact holes 34. The barrier metal layer may for example be a laminated film containing Ti and TiN. Specifically, first, a laminated film whose lower layer is a Ti film and whose upper layer is a TiN film is deposited on the interlayer insulating layer 30 and in each of the contact holes. In this example, the Ti film, which is the lower layer, is disposed in such a way as to have contact with the source electrodes 19 in the source contact holes 38, have contact with the contact electrodes 119 in the body contact holes 36, have contact with the first electrode 21 in the first gate contact holes 32, and have contact with the second electrode 22 in the second gate contact holes 34. Next, a photoresist mask is formed, and the laminated film is etched. This forms the barrier metal layer in a desired place. In the barrier metal layer, the thickness of the Ti film is for example 20 nm, and the thickness of the TiN film is for example 40 nm.

Figure 15B:
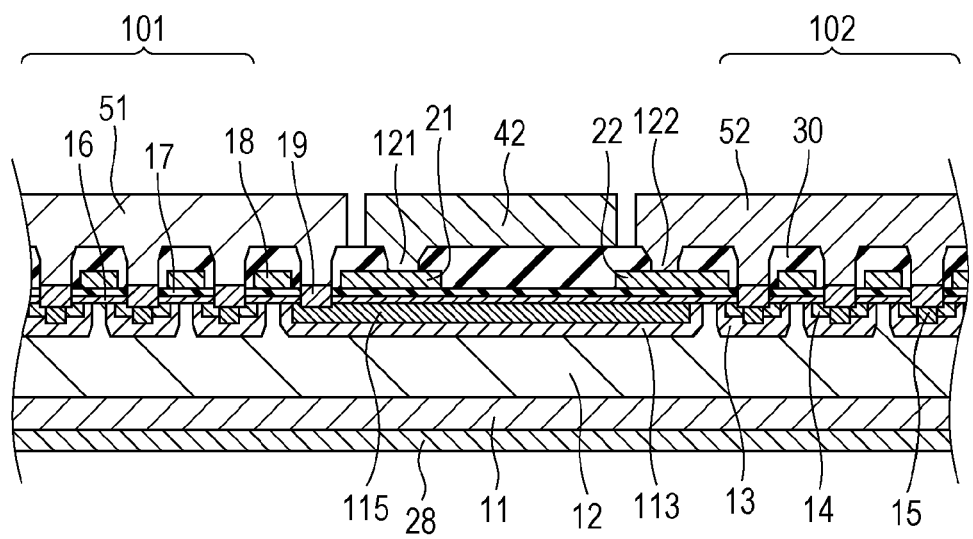
FIG. 15B is a cross-sectional view for explaining the method for manufacturing a semiconductor device of Embodiment 1.

Then, as shown in FIG. 15B, a source pad 51, a gate pad (not illustrated), a gate wiring 42, and a source wiring 52 are formed. In this example, an aluminum film is deposited as a wiring metal film on the barrier metal layer and the interlayer insulating layer 30, and is etched into a desired pattern. The aluminum film may have a thickness of, for example, approximately 4 μm. This provides the source pad 51 in the first element region 101, the source wiring 52 in the second element region 102, and the gate wiring 42 above the second-conductivity-type region 113.

The source pad 51 or the source wiring 52 is electrically connected to the source electrodes 19 of the first and second unit cells in the source contact holes 38 to form source contact portions. Further, the source pad 51 or the source wiring 52 is electrically connected to the contact electrodes 119 in the body contact holes 36 to form body contact portions. The gate wiring 42 is electrically connected to the first electrode 21 in the first gate contact holes 32 to form first gate contact portions 121. Further, the source wiring 52 is electrically connected to the second electrode 22 in the second gate contact holes 34 to form second gate contact portions 122.

Figure 16A:
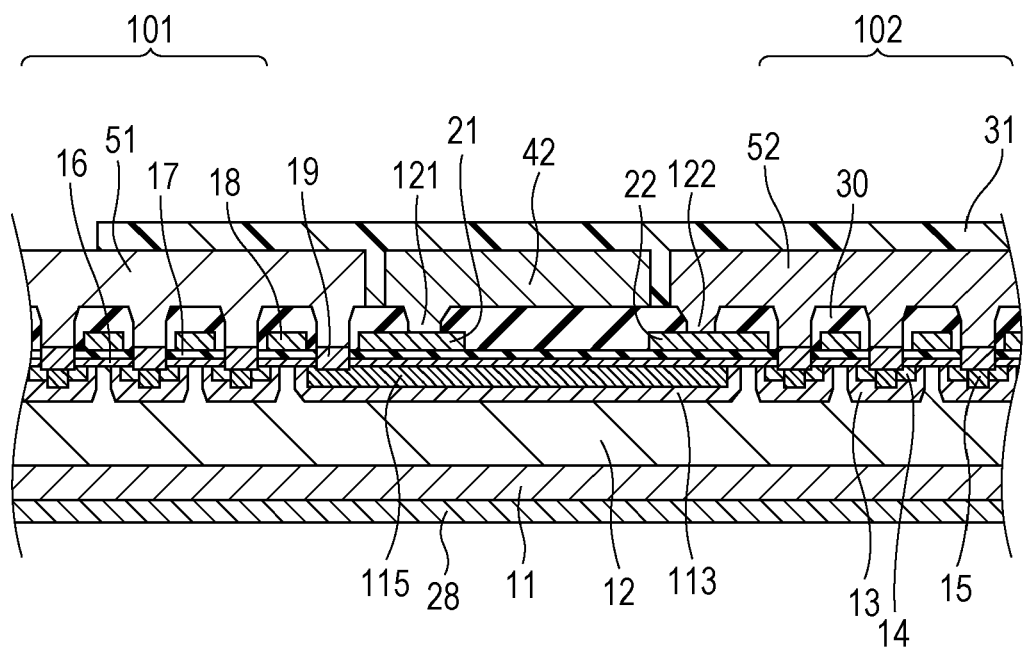
FIG. 16A is a cross-sectional view for explaining the method for manufacturing a semiconductor device of Embodiment 1.

Next, as shown in FIG. 16A, a passivation layer 31 is formed in such a way as to cover the source pad 51, the source wiring 52, the gate pad, and the gate wiring 42. The passivation layer 31 may be made of SiN or polyimide having a thickness of, for example, approximately 1 to 2 μm. The passivation layer 31 is patterned so that at least parts of the source pad 51 and the gate pad 41 are exposed.

Figure 16B:
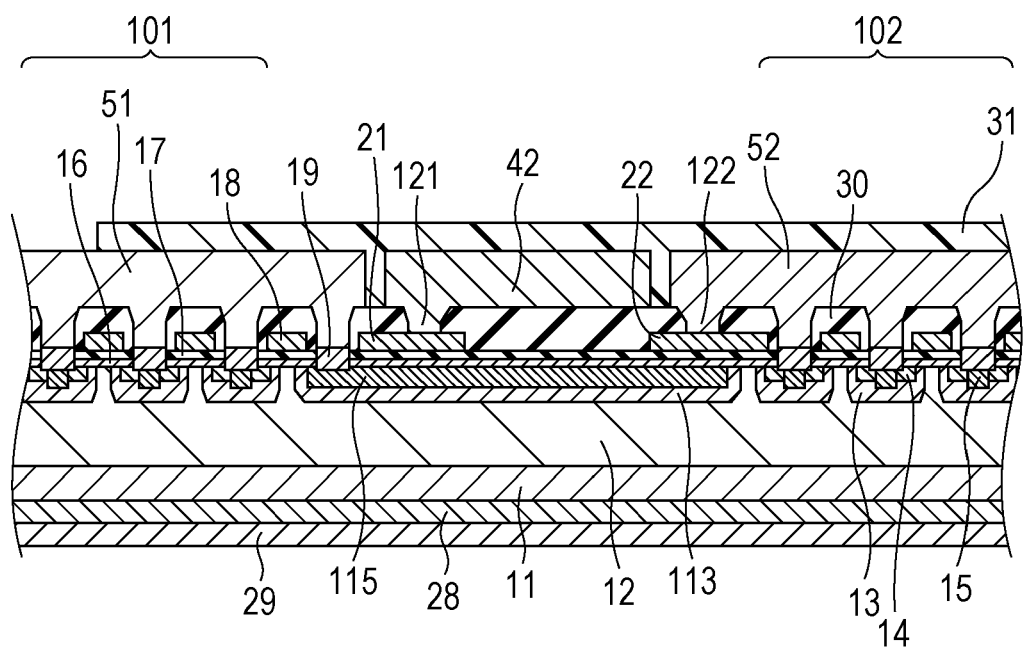
FIG. 16B is a cross-sectional view for explaining the method for manufacturing a semiconductor device of Embodiment 1.

Then, as shown in FIG. 16B, a die-bonding back-surface electrode 29 is formed on a back surface of the drain electrode 28. In this example, a Ti film, a Ni film, and a Ag film are deposited, for example, in this order to give the back-surface electrode 29, which is made of a Ti/Ni/Ag laminated film. The Ti film, the Ni film, and the Ag film have thicknesses of, for example, 0.1 μm, 0.3 μm, and 0.7 μm, respectively. In this way, the semiconductor device 1001 is manufactured.

Modifications

Modifications of semiconductor devices of Embodiment 1 are described with reference to the drawings.

FIG. 17 is a plan view illustrating part of a semiconductor device 1002 of a first modification. In FIG. 17, constituent elements that are identical to those shown in FIG. 1 are given the same reference numerals.

The semiconductor device 1002 differs from the semiconductor device 1001 shown in FIG. 1 in that the second electrode 22 of the second element region 102 extends to below the gate wiring 42. Therefore, when seen in a plan view, the second electrode 22 and the gate wiring 42 partially overlap each other. Such a configuration makes it possible to selectively connect the second electrode 22 to either the gate wiring 42 or the source wiring 52 simply by changing the positions of the gate contact holes, without making the manufacturing method complicated.

Figure 18A:
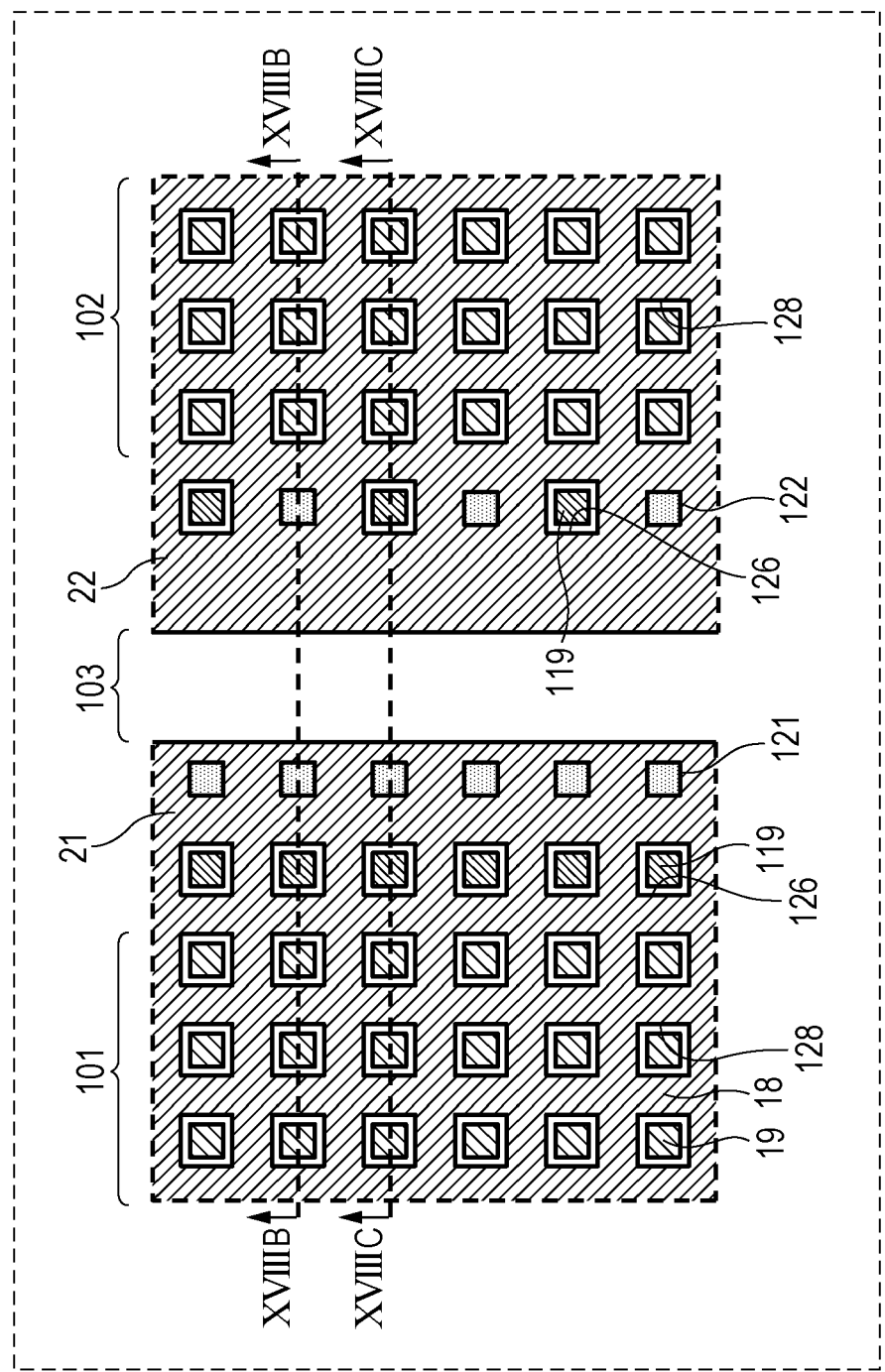
FIG. 18A is a top view for explaining a positional relationship between a first electrode, a second electrode, and contact portions in the semiconductor device of the first modification of Embodiment 1.
Figure 18B:
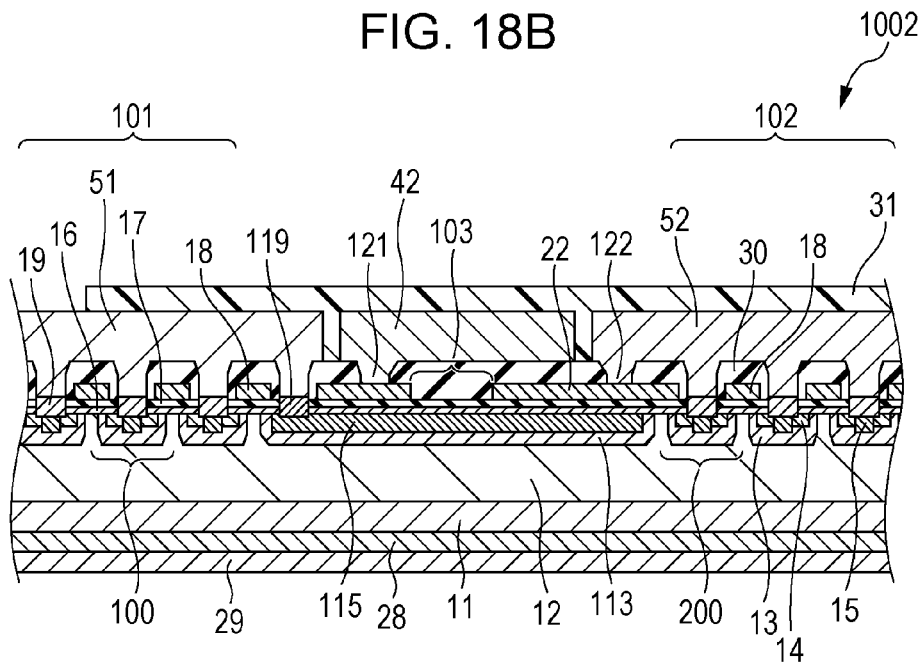
FIG. 18B is a schematic cross-sectional view of the semiconductor device of the first modification of Embodiment 1.
Figure 18C:
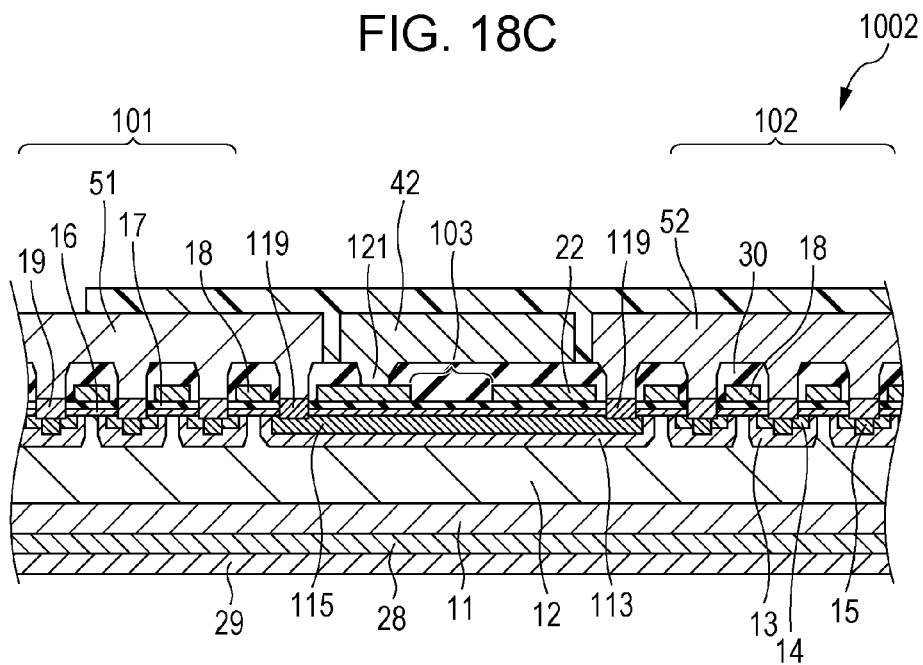
FIG. 18C is a schematic cross-sectional view of the semiconductor device of the first modification of Embodiment 1.

FIG. 18A is a top view showing a positional relationship between the first electrode 21, the second electrode 22, and the first gate contact portions 121, the second gate contact portions 122, the body contact portions, and the source contact portions in the semiconductor device 1002 of the first modification. FIGS. 18B and 18C are cross-sectional views taken along the lines XVIIIB-XVIIIB and XVIIIC-XVIIIC, respectively, in FIG. 18A. In these drawings, constituent elements that are identical to those shown in FIGS. 5A to 5C are given the same reference numerals.

The following describes points of difference from the semiconductor device 1001 shown in FIGS. 5A to 5C. Components that are identical to those of the semiconductor device 1001 are not described here.

In the semiconductor device 1001 described above, the second electrode 22 does not extend to below the gate wiring 42, and when seen in a plan view, the second electrode 22 and the gate wiring 42 do not overlap each other. On the other hand, in the semiconductor device 1002 of the first modification, the second electrode 22 extends from the second element region 102 to below the gate wiring 42. The width of a region of overlap between the gate wiring 42 and the second electrode 22 in a top view of the semiconductor device 1002 is set to be equal to or larger than the width or inner diameter of each of the second gate contact holes 34 formed in the interlayer insulating layer 30. This makes it possible to dispose the second gate contact portions 122 in the region of overlap.

In the semiconductor device 1002, the first unit cells 100 disposed in the first element region 101 function as transistors. Meanwhile, the second unit cells 200 disposed in the second element region 102 function as diodes, as the second electrode 22, which includes the gate electrodes 18 of the second unit cells 200, is electrically connected to the source wiring 52.

The semiconductor device 1001 shown in FIG. 5A and the semiconductor device 1002 shown in FIG. 18A can have substantially equal static characteristics, i.e. current-voltage characteristics as transistors and diodes. However, in the semiconductor device 1002, the functions of the second unit cells 200 can be changed simply by changing part of the semiconductor device forming step, as the second electrode 22 extends in such a way as to partially overlap the gate wiring 42. Specifically, the second electrode 22 can be electrically connected to the gate wiring 42 at the second gate contact portions 122 by disposing the second gate contact portions 122 in the region of overlap between the second electrode 22 and the gate wiring 42. This makes it possible to use the second element region 102 as a transistor region.

Figure 19:
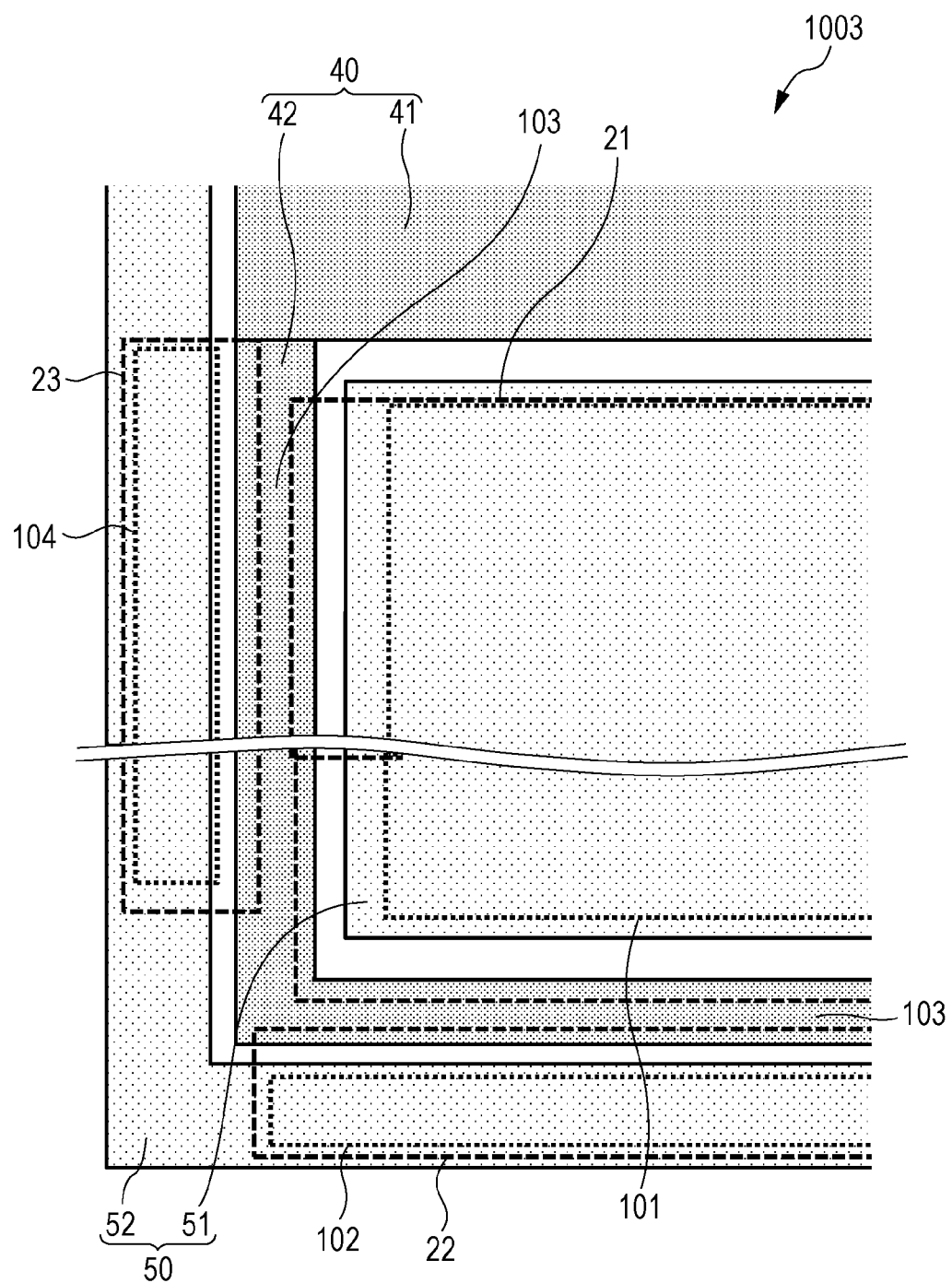
FIG. 19 is a plan view illustrating part of a semiconductor device of a second modification of Embodiment 1.

FIG. 19 is a plan view illustrating part of a semiconductor device 1003 of a second modification. In FIG. 19, constituent elements that are identical to those shown in FIG. 17 are given the same reference numerals.

The semiconductor device 1003 differs from the semiconductor device 1002 in that the semiconductor device 1003 further includes a third element region 104 in addition to the first element region 101 and the second element region 102. In the example shown in FIG. 19, the first element region 101, which is a transistor region, the second element region 102, which is a diode region, and the third element region 104 are is disposed in the regions 210, 203, and 202, respectively, shown in FIG. 2. However, the disposition of the element regions is not limited to this example. The following describes only points of difference from the semiconductor device 1002.

When seen in a plan view, the third element region 104 is adjacent to the first element region 101 with the gate wiring 42 interposed therebetween. The third element region 104 includes third unit cells. The third unit cells are identical in configuration to the first and second unit cells 100 and 200 described above with reference to FIGS. 3. In the third element region 104, a third electrode 23 including the respective gate electrodes of the third unit cells is disposed. The third electrode 23 is separated from the first electrode 21 and the second electrode 22. The third electrode 23 may extend to below the gate wiring 42.

The third electrode 23 is electrically connected, for example, to the source 50. In this case, the third unit cells function as diode cells. It should be noted that, as will be described later, the third electrode 23 may be connected to the gate 40. In this case, the third unit cells function as transistor cells.

In the second modification, when seen in a plan view, parts of the second electrode 22 and the third electrode 23 overlap the gate wiring 42. This makes it possible to selectively connect the second electrode 22 and the third electrode 23 to either the gate wiring 42 or the source wiring 52 simply by changing the positions of the gate contact holes, without making the manufacturing method complicated. The following describes an example of a connection between the third electrode 23 and a wiring with reference to the drawings.

Figure 20A:
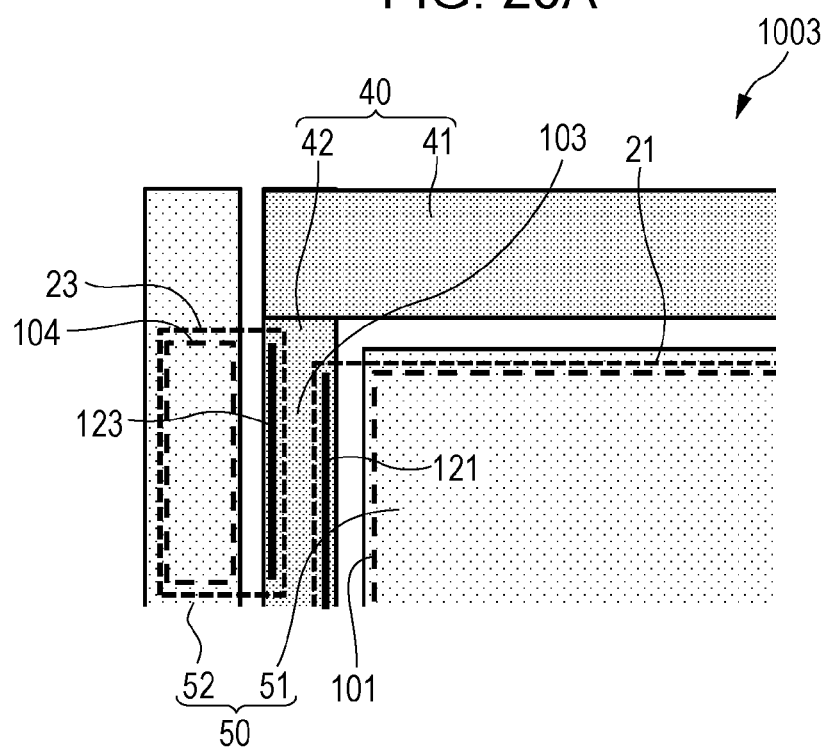
FIG. 20A is a schematic top view for explaining an example of a connection between a third electrode and a wiring in a third element region.
Figure 20B:
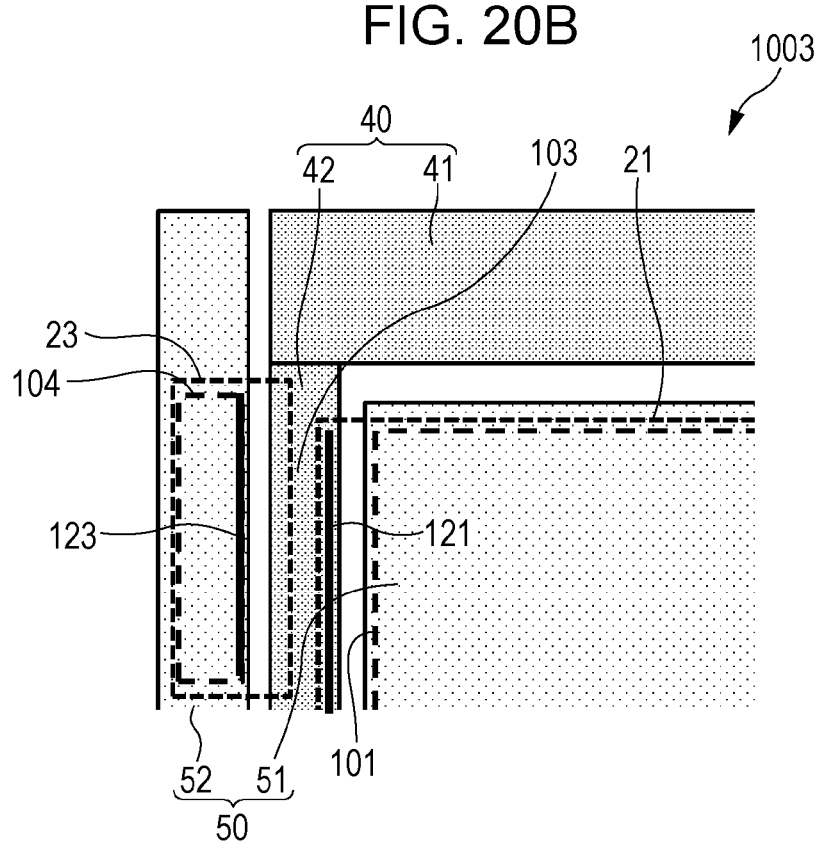
FIG. 20B is a schematic top view for explaining an example of a connection between a third electrode and a wiring in a third element region.

FIGS. 20A and 20B are each a schematic top view illustrating the first element region 101 and the third element region 104.

The first electrode 21 and the third electrode 23 both extend to below the gate wiring 42. The first electrode 21 is connected to the gate wiring 42 at the first gate contact portion 121. The first gate contact portion 121 is disposed in a region of overlap between the first electrode 21 and the gate wiring 42.

As shown in FIG. 20A, a third gate contact portion 123 at which the third electrode 23 is connected to the gate wiring 42 may be disposed in a region of overlap between the third electrode 23 and the gate wiring 42, and the third electrode 23 may be connected to the gate wiring 42 at the third gate contact portion 123. In this case, the third unit cells function as transistor cells, and the third element region 104 serves as a transistor region.

Meanwhile, as shown in FIG. 20B, the third gate contact portion 123 may be disposed in a region of overlap between the third electrode 23 and the source wiring 52, and the third electrode 23 may be connected to the source wiring 52 at the third gate contact portion 123. In this case, the third unit cells function as diode cells, and the third element region 104 serves as a diode region.

The configuration of the first element region 101 and the second element region 102 of the semiconductor device 1003 is identical to the configuration described above with reference to FIGS. 18A, 18B, and 18C. The third element region 104 varies in configuration depending on whether it is used as a diode region or a transistor region. The configuration of third element region 104 in a case where the third element region 104 is used as a diode region is identical to the configuration of the second element region 102, and as such, is not described here.

The configuration of third element region 104 in a case where the third element region 104 is used as a transistor region is described below with reference to the drawings.

Figure 21B:
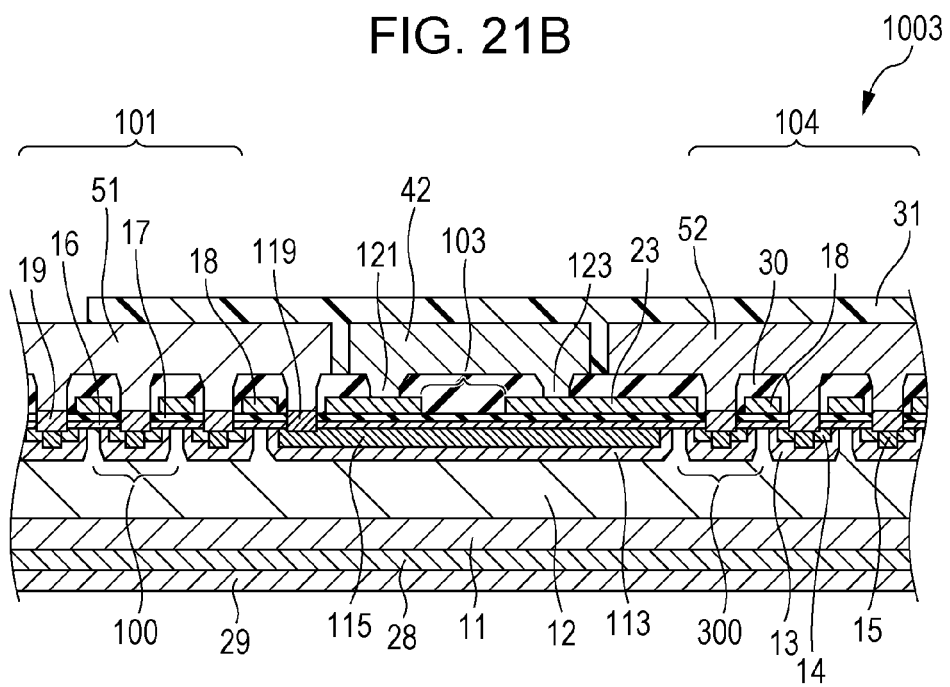
FIG. 21B is a schematic cross-sectional view of the semiconductor device of the second modification of Embodiment 1.
Figure 21C:
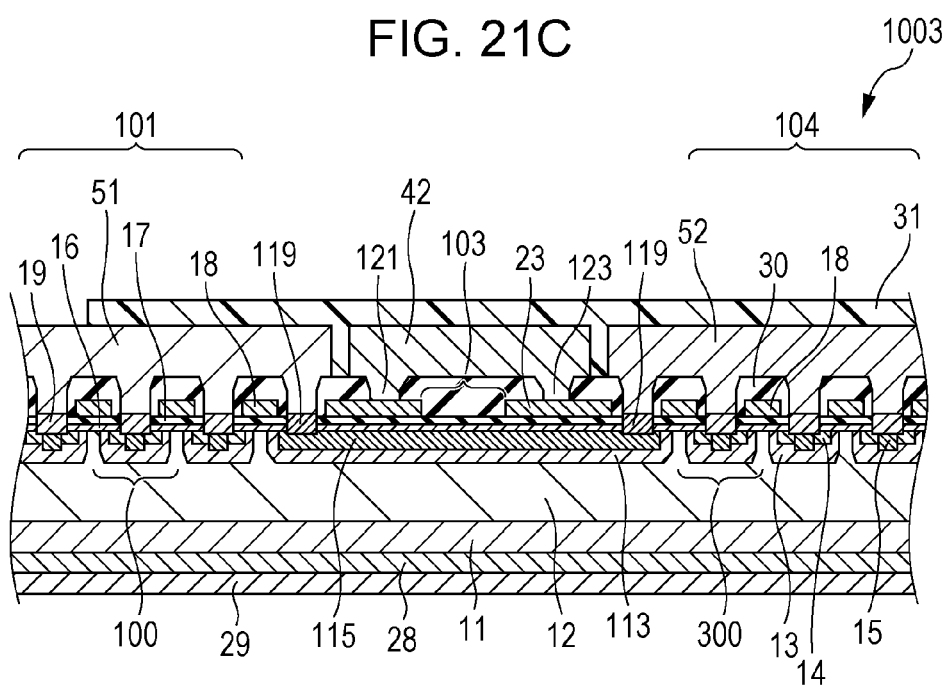
FIG. 21C is a schematic cross-sectional view of the semiconductor device of the second modification of Embodiment 1.

FIG. 21A is a top view showing a positional relationship between the first electrode 21, the third electrode 23, and the contact portions in the first element region 101 and third element region 104 of the semiconductor device 1003. FIGS. 21B and 21O are cross-sectional views taken along the lines XXIB-XXIB and XXIC-XXIC, respectively, in FIG. 21A. The first element region 101 and the second element region 102 are identical to those of the semiconductor device 1002, and as such, are not described here.

In the third element region 104 of the semiconductor device 1003, third unit cells 300 and the third electrode 23, which includes the gate electrodes 18 of the third unit cells 300, are disposed. The third unit cells 300 are disposed, for example, below the source wiring 52.

Each of the third unit cells 300 is configured as described above with reference to FIG. 3. Further, the configuration of the body contact portions and the source contact portions in the third element region 104 is identical to the configuration of the body contact portions and the source contact portions in the second element region 102 described above with reference to FIGS. 18A, 18B, and 18O. Constituent elements that are identical to those of the second element region 102 are here given the same reference numerals.

When seen in a plan view, the third electrode 23 extends from the third element region 104 to below the gate wiring 42. The third gate contact portions 123 are disposed in the region of overlap between the gate wiring 42 and the third electrode 23. The width of the region of overlap between the gate wiring 42 and the third electrode 23 is for example set to be equal to or larger than the width or inner diameter of each of the gate contact holes formed in the interlayer insulating layer 30.

At the third gate contact portions 123, the third electrode 23 is electrically connected to the gate wiring 42 in third gate contact holes formed in the interlayer insulating layer 30. Therefore, the third unit cells 300 function as transistor cells.

Whether the third element region 104 is used as a diode region or a transistor region can be chosen simply by changing masks for forming, in the interlayer insulating layer 30, the third gate contact holes through which the third electrode 23 is exposed.

Figure 22A:
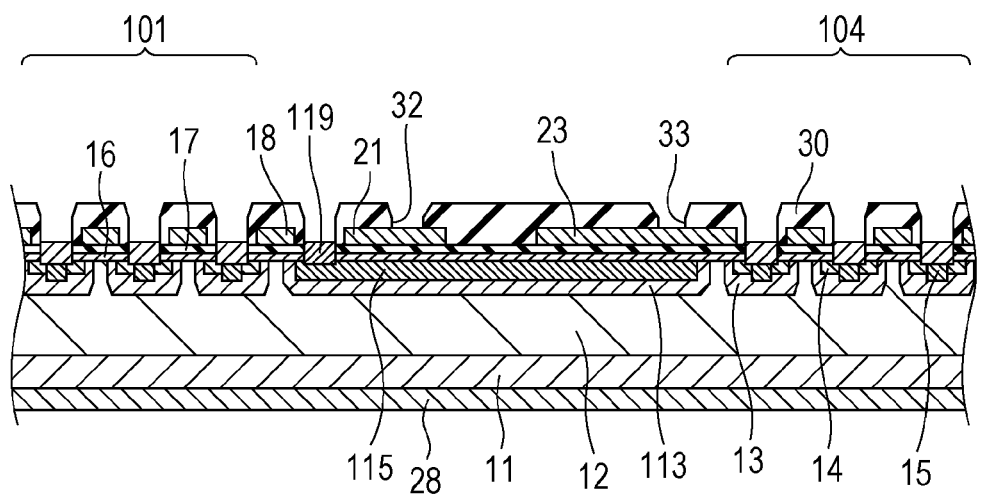
FIG. 22A is a cross-sectional view for explaining a method for manufacturing a semiconductor device of the second modification of Embodiment 1.
Figure 22B:
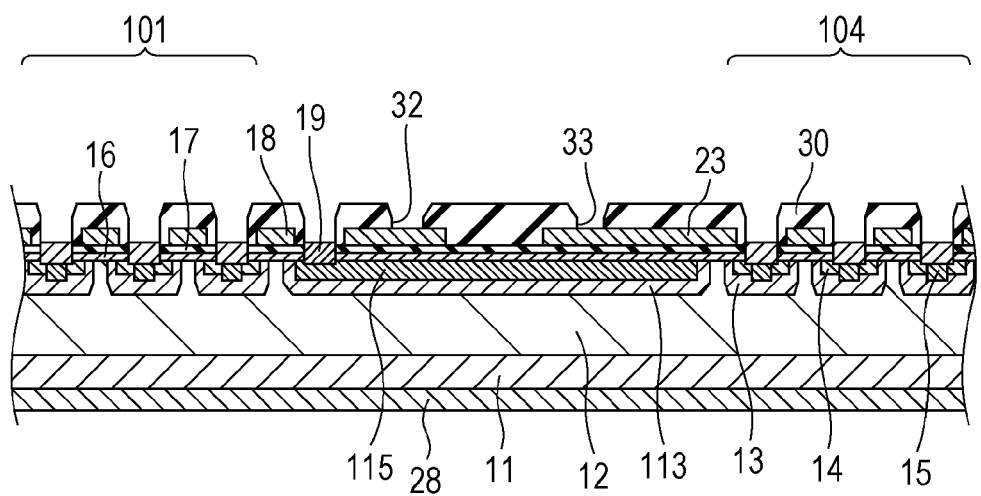
FIG. 22B is a cross-sectional view for explaining the method for manufacturing a semiconductor device of the second modification of Embodiment 1.

FIG. 22A is a cross-sectional view for explaining a method for manufacturing a semiconductor device 1003 in a case where the third element region 104 is used as a diode region. FIG. 22B is a cross-sectional view for explaining a method for manufacturing a semiconductor device 1003 in a case where the third element region 104 is used as a transistor region. FIGS. 22A and 22B both show the step of etching the interlayer insulating layer 30 in the first element region 101 and the third element region 104. The second element region 102 is not illustrated or described here, as it has already been described above with reference to FIG. 15A.

In the step of etching the interlayer insulating layer 30, in the same manner as that described above with reference to FIG. 15A, first gate contact holes 32 and third gate contact holes 33 are formed by etching parts of the interlayer insulating layer 30 after having formed a photoresist mask. The first gate contact holes 32 are disposed in such a way as to expose parts of the first electrode 21 that are located above the second-conductivity-type region 113. The third gate contact holes 33 are disposed in such a way as to expose parts of the third electrode 23 that are located above the second-conductivity-type region 113. At this point in time, in forming a diode region as the third element region 104, as shown in FIG. 22A, the third gate contact holes 33 are disposed in a region in which the source wiring 52 is formed in a subsequent step. On the other hand, in forming a transistor region as the third element region 104, as shown in FIG. 22B, the third gate contact holes 33 are disposed in a region in which the gate wiring 42 is formed in a subsequent step. Therefore, in FIG. 22B, the position of a third gate contact hole 33 is closer to the first element region 101 than in FIG. 22A.

Thus, extending the third electrode 23 to below the gate wiring 42 makes it possible to arbitrarily select the structure and function of the third element region 104 by changing masks that are used in the step of etching the interlayer insulating layer 30.

Continued reference is here made to FIG. 2. Disposing the first element region 101, which is a transistor region, below the source pad 51 makes it possible to use some or all of the regions 201 to 205 as diode regions. In this case, unit cells and a gate common electrode may be disposed in each of the regions 201 to 205, and each gate common electrode may be extended to below the gate wiring 42. This makes it possible to choose, according to the disposition of the gate contact holes, whether to connect the gate common electrode to the gate or the source, as described above with reference to FIGS. 20A and 20B. This in turn makes it possible to arbitrarily choose whether to dispose diode cells or transistor cells in each of the regions 201 to 205. It should be noted that only the gate common electrodes of some of the regions 201 to 205 may be extended to below the gate wiring 42.

In Embodiment 1, a transistor region and a diode region need only be disposed with the gate wiring 42 as a boundary therebetween. In the example described above, a transistor region is disposed below the source pad 51, and a diode region is disposed below the source wiring 52. Alternatively, a transistor region may be disposed below the source wiring 52, and a diode region may be disposed below the source pad 51. Alternatively, in a case where the source pad 51 is divided into two parts and the gate wiring 42 is provided between two source pads thus divided, a transistor region may be disposed below one of the two source pads thus divided, and a diode region may be disposed below the other source pad. Thus, a transistor region and a diode region may be disposed in any of the regions 201 to 205 and 210, in which the source pad 51 or the source wiring 52 is formed.

Embodiment 1 gives a description of a case where silicon carbide is 4H—SiC. Alternatively, silicon carbide may be another polytype such as 6H—SiC, 3C—SiC, or 15R—SiC. Further, the substrate 11 used is a SiC substrate whose principal surface is a surface cut off from a (0001) surface. Alternatively, the substrate 11 used may be a SiC substrate whose principal surface is a (11-20) surface, a (1-100) surface, a (000-1) surface, or an offcut surface thereof. Alternatively, the substrate 11 may be a Si substrate, and the first silicon carbide semiconductor layer 20 may be a 3C—SiC layer. In this case, annealing for activating impurity ions implanted into the 3C—SiC layer may be carried out at a temperature equal to or lower than the melting point of the Si substrate.

What is claimed is:

1. A semiconductor device comprising:
   a semiconductor substrate of a first conductivity type, having a first principal surface and a second principal surface;
   a first silicon carbide semiconductor layer of the first conductivity type, disposed on the first principal surface of the semiconductor substrate;
   unit cells;
   a source including a source pad and a source wiring extending from the source pad; and
   a gate including a gate pad and a gate wiring extending from the gate pad, wherein:
   each of the unit cells includes:
      a body region of a second conductivity type, disposed in the first silicon carbide semiconductor layer;
      a source region of the first conductivity type, disposed in contact with the body region;
      a second silicon carbide semiconductor layer of the first conductivity type, disposed on the first silicon carbide semiconductor layer and in contact with at least part of the body region and at least part of the source region;
      a gate insulating layer disposed on the second silicon carbide semiconductor layer;
      a gate electrode disposed on the gate insulating layer and above the body region, the gate insulating layer and the second silicon carbide semiconductor layer being interposed between the gate electrode and the body region;
      a source electrode electrically connected to the source region and electrically connected to the source; and
      a drain electrode disposed on the second principal surface of the semiconductor substrate,
   the unit cells include first unit cells disposed in a first element region and second unit cells disposed in a second element region, and in a plan view, the first element region and the second element region are adjacent to each other with the gate wiring interposed between the first and second element regions,
   at least some of the first unit cells are disposed below one of the source pad and the source wiring,
   at least some of the second unit cells are disposed below another of the source pad and the source wiring,
   a first electrode including the gate electrode of each of the first unit cells is disposed in the first element region and electrically connected to the gate,
   a second electrode including the gate electrode of each of the second unit cells is disposed in the second element region and not electrically connected to the gate, and
   the first electrode and the second electrode are separated from each other below the gate wiring.

2. The semiconductor device according to claim 1, wherein the first electrode is electrically connected to the gate wiring below the gate wiring.

3. The semiconductor device according to claim 1, wherein the second electrode is electrically connected to the source.

4. The semiconductor device according to claim 1, wherein in a plan view, the second electrode extends from the second element region so as to partially overlap the gate wiring.

5. The semiconductor device according to claim 1, wherein:
   the unit cells further include third unit cells disposed in a third element region,
   in a plan view, the third element region is adjacent to the first element region with the gate wiring interposed between the first and third element regions,
   a third electrode including the gate electrode of each of the third unit cells is disposed in the third element region and separated from the first electrode and the second electrode.

6. The semiconductor device according to claim 5, wherein the third electrode is electrically connected to the source.

7. The semiconductor device according to claim 5, wherein the third electrode is electrically connected to the gate.

8. The semiconductor device according to claim 5, wherein in a plan view, the third electrode partially extends from the third element region so as to overlap the gate wiring.

9. The semiconductor device according to claim 1, further comprising a second-conductivity-type region disposed below the gate wiring and disposed in the first silicon carbide semiconductor layer,
   wherein in a plan view, the first electrode and the second electrode are separated from each other above the second-conductivity-type region.

10. The semiconductor device according to claim 9, wherein:
    in a plan view, the second-conductivity-type region overlaps part of the first electrode and part of the second electrode, and
    the second-conductivity-type region and the source are electrically connected to each other in an opening in the first electrode and an opening in the second electrode.

11. The semiconductor device according to claim 1, wherein:
    when, in each of the first unit cells, $V_{ds}$ and $V_{gs}$, which are electric potentials based on the source electrode, are applied to the drain electrode and the gate electrode, respectively,
    in a case where $V_{gs} \geq V_{th}$, where $V_{th}$ is a gate threshold voltage, an electric current flows from the drain electrode to the source electrode, and in a case where Vgs<Vth, as Vds becomes smaller than 0 volt, an electric current flows from the source electrode to the drain electrode via the second silicon carbide semiconductor layer before an electric current starts to flow from the source electrode to the drain electrode via the body region.

12. The semiconductor device according to claim 11, wherein when Vgs is 0 volt, Vds at which an electric current of 1 mA flows from the source electrode to the drain electrode via the second silicon carbide semiconductor layer is equal to or larger than −1 V at room temperature.

13. The semiconductor device according to claim 1, wherein:
   each of the first unit cells is a transistor, and
   each of the second unit cells is a diode.

* * * * *